(12) United States Patent
Chu et al.

(10) Patent No.: US 10,763,234 B2
(45) Date of Patent: Sep. 1, 2020

(54) SEMICONDUCTOR DEVICE STRUCTURE HAVING SEMICONDUCTOR DIE BONDED TO REDISTRIBUTION LAYER VIA ELECTRICAL PAD WITH BARRIER LAYER

(71) Applicant: Advanced Semiconductor Engineering, Inc., Kaohsiung (TW)

(72) Inventors: Ming Hsien Chu, Kaohsiung (TW); Chi-Yu Wang, Kaohsiung (TW)

(73) Assignee: ADVANCED SEMICOMDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/162,346

(22) Filed: Oct. 16, 2018

(65) Prior Publication Data

US 2020/0118936 A1    Apr. 16, 2020

(51) Int. Cl.
*H01L 23/00* (2006.01)
*H01L 23/31* (2006.01)
*H01L 25/065* (2006.01)
*H01L 21/56* (2006.01)
*H01L 23/498* (2006.01)
*H01L 23/538* (2006.01)

(52) U.S. Cl.
CPC ........... *H01L 24/73* (2013.01); *H01L 21/565* (2013.01); *H01L 23/3171* (2013.01); *H01L 23/49816* (2013.01); *H01L 23/49827* (2013.01); *H01L 23/49838* (2013.01); *H01L 23/5383* (2013.01); *H01L 24/11* (2013.01); *H01L 24/16* (2013.01); *H01L 25/0657* (2013.01); *H01L 2224/11849* (2013.01); *H01L 2224/16059* (2013.01); *H01L 2224/16503* (2013.01); *H01L 2224/73204* (2013.01); *H01L 2225/06517* (2013.01); *H01L 2225/06524* (2013.01); *H01L 2225/06548* (2013.01)

(58) Field of Classification Search
CPC ................. H01L 24/73; H01L 23/3171; H01L 23/49816; H01L 23/49838; H01L 23/5383; H01L 24/04; H01L 24/05; H01L 24/06
See application file for complete search history.

(56) References Cited

U.S. PATENT DOCUMENTS

| | | | |
|---|---|---|---|
| 2011/0233761 A1* | 9/2011 | Hwang | H01L 21/76885 257/737 |
| 2016/0260684 A1* | 9/2016 | Zhai | H01L 25/0652 |
| 2017/0170155 A1* | 6/2017 | Yu | H01L 23/3142 |
| 2019/0103353 A1* | 4/2019 | Liu | H01L 25/16 |
| 2020/0006274 A1* | 1/2020 | Chiang | H01L 25/105 |

* cited by examiner

*Primary Examiner* — Michael Jung
(74) *Attorney, Agent, or Firm* — Foley & Lardner LLP

(57) ABSTRACT

A wiring structure includes a redistribution layer and an electrical pad. The redistribution layer includes a passivation layer and a metal layer. The metal layer is embedded in the passivation layer, and the passivation layer defines an opening to expose a portion of the metal layer. The electrical pad is disposed in the opening of the passivation layer and on the metal layer. The electrical pad includes a seed layer, a conductive layer, a barrier layer and an anti-oxidation layer.

15 Claims, 34 Drawing Sheets

SEMICONDUCTOR DEVICE STRUCTURE HAVING SEMICONDUCTOR DIE BONDED TO REDISTRIBUTION LAYER VIA ELECTRICAL PAD WITH BARRIER LAYER

BACKGROUND

1. Field of the Disclosure

The present disclosure relates to a wiring structure, a semiconductor device structure, and a manufacturing method, and to a wiring structure and a semiconductor device structure for fan-out packaging, and a method for manufacturing the same.

2. Description of the Related Art

In a manufacturing process of a semiconductor device structure, a semiconductor die may be connected to an electrical pad of a substrate through a solder joint. Then, a plurality of thermal processes may be conducted multiple times to form other elements (e.g., redistribution layer or conductive post) of the semiconductor device structure during the subsequent manufacturing stages. However, these thermal processes may adversely affect the quality of the solder joint, resulting in poor reliability.

SUMMARY

In some embodiments, a wiring structure includes a redistribution layer and an electrical pad. The redistribution layer includes a passivation layer and a metal layer. The metal layer is embedded in the passivation layer, and the passivation layer defines an opening to expose a portion of the metal layer. The electrical pad is disposed in the opening of the passivation layer and on the metal layer. The electrical pad includes a seed layer, a conductive layer, a barrier layer and an anti-oxidation layer.

In some embodiments, a semiconductor device structure includes a first redistribution layer, an electrical pad, a semiconductor die, at least one first conductive post and an encapsulant. The electrical pad is disposed on the first redistribution layer. The electrical pad includes a conductive layer and a barrier layer. The semiconductor die is disposed on the first redistribution layer and electrically connects to the electrical pad. The first conductive post is disposed on the first redistribution layer and adjacent to the semiconductor die. The encapsulant covers the semiconductor die and the first conductive post.

In some embodiments, a method for manufacturing a semiconductor device structure includes: (a) forming a first redistribution layer; (b) forming an electrical pad on the first redistribution layer, wherein the electrical pad includes a conductive layer, a barrier layer and an anti-oxidation layer; (c) forming at least one conductive post on the first redistribution layer; (d) disposing a semiconductor die on the first redistribution layer; and (e) forming an encapsulant to cover the semiconductor die and the conductive post.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
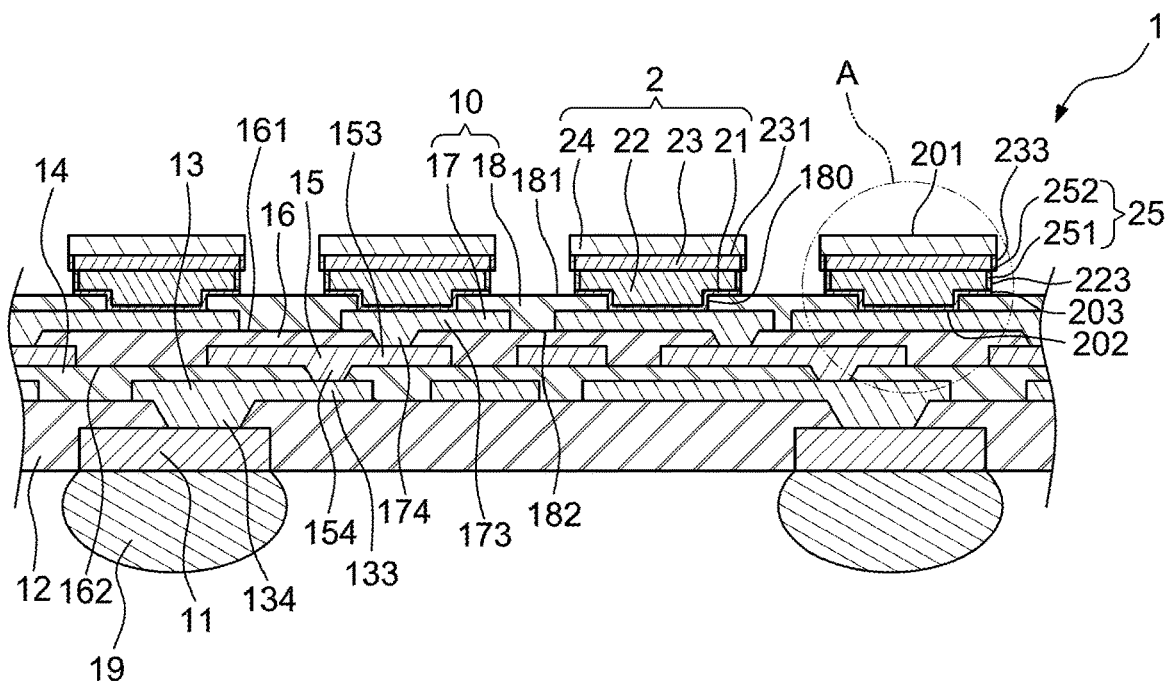
FIG. 1 illustrates a cross sectional view of an example of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a manufacturing process of a semiconductor device structure may include the following stages. Firstly, a substrate including an electrical pad is provided. The electrical pad may be made of copper. A semiconductor die is then connected to the electrical pad through a solder joint made of tin or an alloy including tin. Then, at least one conductive post may be formed on the substrate and adjacent to the semiconductor die, and an encapsulant may be formed to cover the semiconductor die and the conductive post. Further, one end of the conductive post may be exposed from the encapsulant for external connection. Then, a redistribution layer, including at least one passivation layer, may be formed on the encapsulant to electrically connect the conductive post. The stages for forming the conductive post, the encapsulant and the redistribution layer involve thermal processes. During the thermal processes, copper of the electrical pad may readily diffuse into the solder joint made of tin or an alloy including tin, thus forming a large amount of intermetallic compound (IMC), including $Cu_6Sn_5$ and/or $Cu_3Sn$, at the junction of the solder joint and the electrical pad. The large amount of IMC may lower the mechanical strength of the solder joint, thus adversely affecting reliability of the semiconductor device structure. For example, the boundary between the solder joint and the electrical pad may crack easily.

At least some embodiments of the present disclosure provide for a wiring structure and/or a semiconductor device structure which reduces the amount of the IMC in the solder joint and/or modifies the composition of the IMC in the solder joint. In some embodiments, the wiring structure includes an electrical pad, and the electrical pad includes a seed layer, a conductive layer, a barrier layer and an anti-oxidation layer. In some embodiments, the semiconductor device structure includes an electrical pad, and the electrical pad includes a conductive layer and a barrier layer. At least some embodiments of the present disclosure further provide for techniques for manufacturing the semiconductor device structure.

Figure 2:
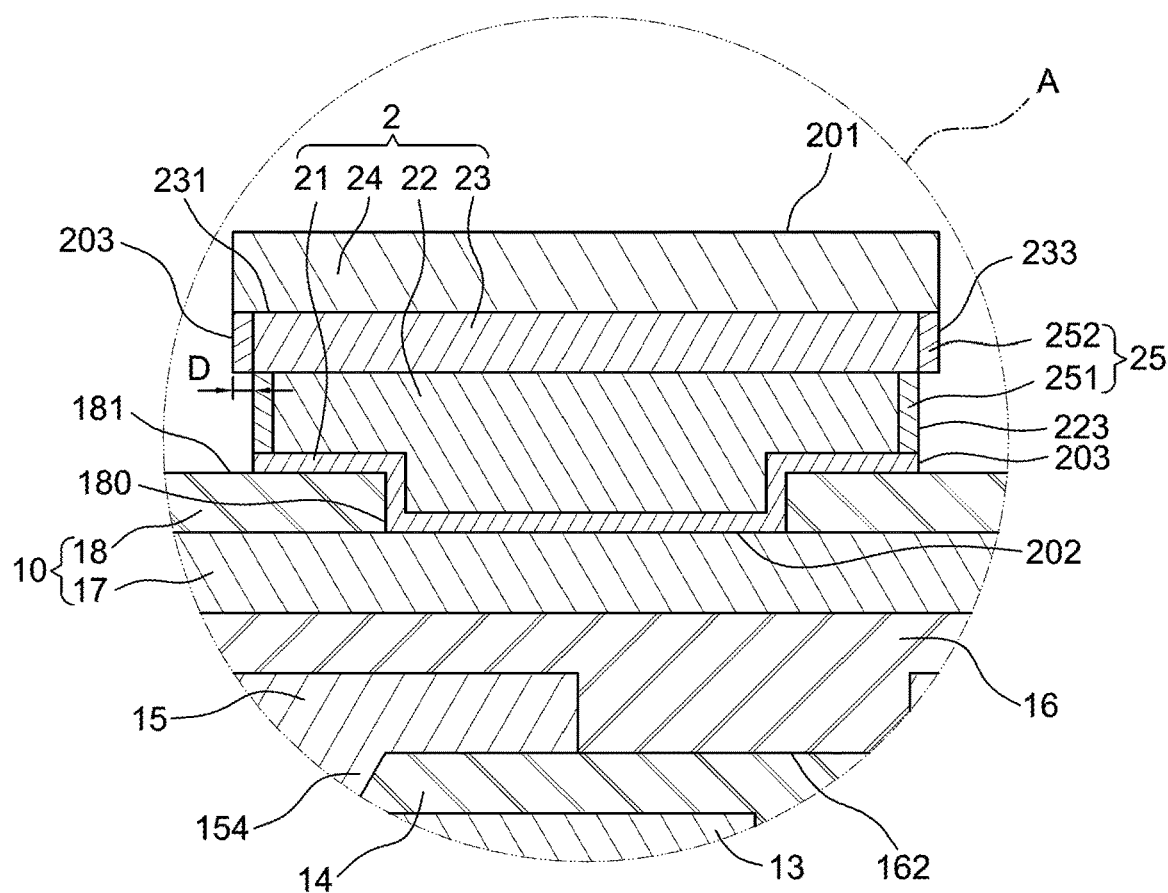
FIG. 2 illustrates an enlarged view of an area "A" shown in FIG. 1.

FIG. 1 illustrates a cross sectional view of a wiring structure 1 according to some embodiments of the present disclosure. FIG. 2 illustrates an enlarged view of an area "A" shown in FIG. 1. The wiring structure 1 includes a first redistribution layer 10 (e.g., including a passivation layer 18 and a metal layer 17), and an electrical pad 2. In some embodiments, the wiring structure 1 may further include a plurality of circuit layers, such as a first circuit layer (e.g., including a passivation layer 12 and a metal layer 11), a second circuit layer (e.g., including a passivation layer 14 and a metal layer 13) disposed on the first circuit layer, and a third circuit layer (e.g., including a passivation layer 16 and a metal layer 15) disposed on the second circuit layer. The first redistribution layer 10 is disposed on the third circuit layer. The wiring structure 1 may be a substrate or a portion of a substrate.

As shown in FIG. 1, the first redistribution layer 10 includes the passivation layer 18 and the metal layer 17. The passivation layer 18 has an upper surface 181, and a lower surface 182 opposite to the upper surface 181. The metal layer 17 is disposed adjacent to the lower surface 182. For example, the metal layer 17 is embedded in the passivation layer 18 and exposed from the lower surface 182 of the passivation layer 18. The metal layer 17 may include a conductive pad 173, a conductive via 174 and a trace (not shown). The conductive via 174 electrically connects to the metal layer 15 of the third circuit layer. The passivation layer 18 defines an opening 180 extending through the passivation layer 18. The opening 180 exposes a portion of the metal layer 17, such as the conductive pad 173 of the metal layer 17. A material of the passivation layer 18 may include an insulating material, a dielectric material or a solder resist material, such as, for example, benzocyclobutene (BCB) based polymer or a polyimide (PI). In some embodiments, the material of the passivation layer 18 may include cured photoimageable dielectric (PID) materials, such as an epoxy or a PI including photoinitiators, or other resin materials. A material of the metal layer 17 may include copper, another conductive metal, or an alloy thereof. A thickness of the passivation layer 18 may be about 7 μm, and a thickness of the metal layer 17 may be about 4 μm.

The electrical pad 2 is disposed in the opening 180 of the passivation layer 18 and on the metal layer 17. The electrical pad 2 has an upper surface 201, a lower surface 202 opposite to the upper surface 201, and a lateral surface 203 extending between the upper surface 201 and the lower surface 202. The lower surface 202 may contact the conductive pad 173 of the metal layer of the first redistribution layer 10. The electrical pad 2 includes a seed layer 21, a conductive layer 22, a barrier layer 23 and an anti-oxidation layer 24. The electrical pad 2 may be adapted for connecting to a semiconductor die. As shown in FIGS. 1 and 2, the upper surface 201 is a surface of the anti-oxidation layer 24, and the lower surface is a surface of the seed layer 21.

The seed layer 21 may be disposed in the opening 180 and on the upper surface 181 of the passivation layer 18. The seed layer 21 may contact the metal layer 17. A material of the seed layer 21 may include titanium and/or copper. In some embodiments, the seed layer 21 includes a titanium layer and a copper layer sequentially disposed on the passivation layer 18. For example, a thickness of the titanium layer may be about 0.1 μm, and a thickness of the copper layer may be about 0.2 μm to about 1 μm.

The conductive layer 22 is disposed on and contacts the seed layer 21. A material of the conductive layer 22 may include copper, another conductive metal, or an alloy thereof. The conductive layer 22 has a lateral surface 223, which is a portion of the lateral surface 203 of the electrical pad 2. A maximum width of an upper portion of the conductive layer 22, which may be located adjacent to the barrier layer 23, may be about 56 μm. A minimum width of a lower portion of the conductive layer 22, which may be located adjacent to the metal layer 17 of the first redistribution layer 10, may be about 30 μm. A maximum thickness of the conductive layer 22 (e.g., at a central axis the conductive layer 22) may be about 10 μm, and a minimum thickness of the conductive layer 22 (e.g., at a periphery of the conductive layer 22) may be about 7 μm. Thus, the conductive layer 22 may be in a "T" shape.

The barrier layer 23 is disposed on and contacts the conductive layer 22. A material of the barrier layer 23 may include nickel. The barrier layer 23 may prevent or reduce diffusion of the material of the conductive layer 22, such as copper, into the anti-oxidation layer 24 or into an internal connector formed on the barrier layer 22 (e.g., the internal connector 48 shown in FIG. 5). The barrier layer 23 has an upper surface 231 and a lateral surface 233, which is a portion of the lateral surface 203 of the electrical pad 2. A maximum width of the barrier layer 22 may be about 60 μm. The maximum width of the conductive layer 22 may be less than the maximum width of the barrier layer 23, such as about 1 μm to about 2 μm less at each side. That is, the lateral surface 223 of the conductive layer 22 may be not coplanar with the lateral surface 233 of the barrier layer 23. Alternatively, the lateral surface 223 of the conductive layer 22 may be recessed from the lateral surface 233 of the barrier layer 23 to form a step structure so as to form a gap D that is, for example, about 1 μm to about 2 μm. In addition, a thickness of the barrier layer 23 may be about 3 μm.

The anti-oxidation layer 24 is disposed on and contacts the barrier layer 23, such as the upper surface 231 of the barrier layer 23. A material of the anti-oxidation layer 24 may include a solder material, such as tin, silver, or an alloy of tin and/or silver. The anti-oxidation layer 24 covers the upper surface 231 of the barrier layer 23, thus is able to protect the upper surface 231 of the barrier layer 23 from oxidation during subsequent thermal processes. However, it is noteworthy that the anti-oxidation layer 24 may be oxidized itself. A maximum width of the anti-oxidation layer 24 may be about 60 μm. The maximum width of the anti-oxidation layer 24 may be substantially equal to the maximum width of the barrier layer 23. A thickness of the anti-oxidation layer 24 may be about 4 μm.

The electrical pad 2 further includes an oxide layer 25 disposed adjacent to the lateral surface 203. For example, the oxide layer 25 may include a first portion 251 disposed adjacent to the lateral surface 223 of the conductive layer 22, and a second portion 252 disposed adjacent to the lateral surface 233 of the barrier layer 23. The first portion 251 of the oxide layer 25 may include copper oxide (e.g., $CuO_x$, "x" is greater than 0 but not greater than 2), and may be formed by oxidation of a peripheral region of the conductive layer 22. The second portion 252 of the oxide layer 25 may include nickel oxide (e.g., $NiO_y$, "y" is greater than 0 but not greater than 2), and may be formed by oxidation of a peripheral region of the barrier layer 23. The oxidation of the conductive layer 22 and the barrier layer 23 may occur due to thermal process (e.g., stripping of photoresist, curing of molding compound and/or passivation layer, etc.) or etching process. The thickness of the first portion 251 and the second portion 252 of the oxide layer 25 may both be about 0.7 μm to about 1.5 μm, respectively. In some embodiments, a thickness of the first portion 251 may be equal to or different from a thickness of the second portion 252. Though not shown in FIG. 2, the seed layer 21 and/or the anti-oxidation layer 24 may also include oxidation layer or oxidation region.

The third circuit layer (e.g., including the passivation layer 16 and the metal layer 15) is disposed on or attached to the lower surface 182 of the passivation layer 18 of the first redistribution layer 10. The third circuit layer may also be a redistribution layer, and structure and material thereof may be similar to those of the first redistribution layer 10 described above. The passivation layer 16 may also have an upper surface 161, and a lower surface 162 opposite to the upper surface 161. The metal layer 15 is disposed adjacent to the lower surface 162. For example, the metal layer 15 is embedded in the passivation layer 16 and exposed from the lower surface 162 of the passivation layer 16. The metal layer 15 may also include a conductive pad 153, a conductive via 154 and a trace (not shown). For example, the conductive via 174 of the metal layer 17 of the first redistribution layer 10 extends through the passivation layer 16 to contact and electrically connect the conductive pad 153 of the metal layer 15 of the third circuit layer. The conductive via 154 of the metal layer 15 of the third circuit layer 15 electrically connects to the second circuit layer (e.g., including the passivation layer 14 and the metal layer 13). A thickness of the passivation layer 16 may be about 7 μm, and a thickness of the metal layer 15 may be about 4 μm.

The second circuit layer (e.g., including the passivation layer 14 and the metal layer 13) and the first circuit layer (e.g., including the passivation layer 12 and the metal layer 11) are similar to the third circuit layer (e.g., including the passivation layer 16 and the metal layer 15) and/or the first redistribution layer 10 (e.g., including the passivation layer 18 and the metal layer 17), thus are not repeat redundantly hereinafter. A thickness of the passivation layer 14 of the second circuit layer may be about 7 μm, and a thickness of the metal layer 13 of the second circuit layer may be about 4 μm. A thickness of the passivation layer 12 of the first circuit layer may be about 14 μm, and a thickness of the metal layer 11 of the first circuit layer may be about 8.5 μm. A solder ball 19 is disposed on an exposed portion of the metal layer 11 of the first circuit layer for external connections. In some embodiments, the wiring structure 1 may include more or less than three circuit layers.

Since the electrical pad 2 includes the barrier layer 23, diffusion of the material of the conductive layer 22 through the barrier layer 23 may be prevented or at least reduced. Hence, IMC (e.g., including $Cu_6Sn_5$ and/or $Cu_3Sn$,) formed in the anti-oxidation layer 24 or in an internal connector on the barrier layer 22 can be prevented or reduced. Cracks between the electrical pad 2 and the internal connector formed thereon (e.g., the internal connector 48 shown in FIG. 5) are avoided, thus improving reliability of the wiring structure 1. Besides, the anti-oxidation layer 24 covers the upper surface 231 of the barrier layer 23, thus is able to protect the upper surface 231 of the barrier layer 23 from oxidation during subsequent thermal processes. In some embodiments, oxidation of the barrier layer 23 may reduce conductivity of the barrier layer 23. During a subsequent reflowing process for melting the anti-oxidation layer 24, since the maximum width of the conductive layer 22 is less than the maximum width of the barrier layer 23, and since the oxide layer 25 is formed adjacent to the lateral surface 203 of the electrical pad 2, the molten anti-oxidation layer 24 can be retained on the barrier layer 23 without flowing down to contact the conductive layer 22.

Figure 3:
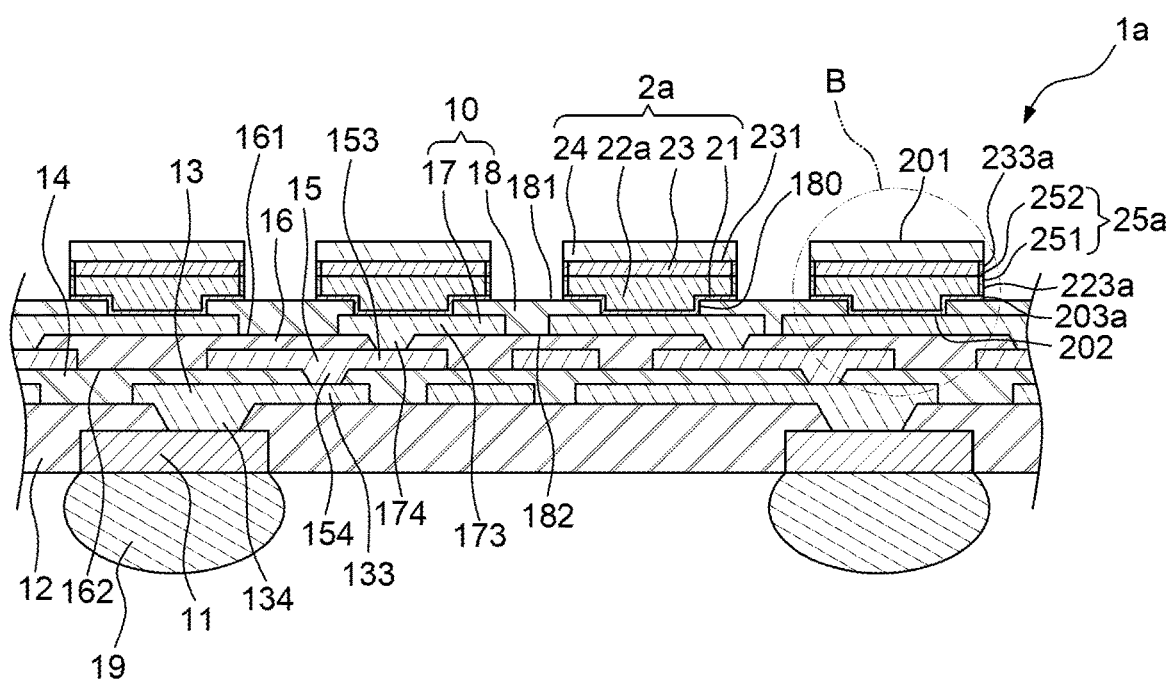
FIG. 3 illustrates a cross sectional view of an example of a wiring structure according to some embodiments of the present disclosure.
Figure 4:
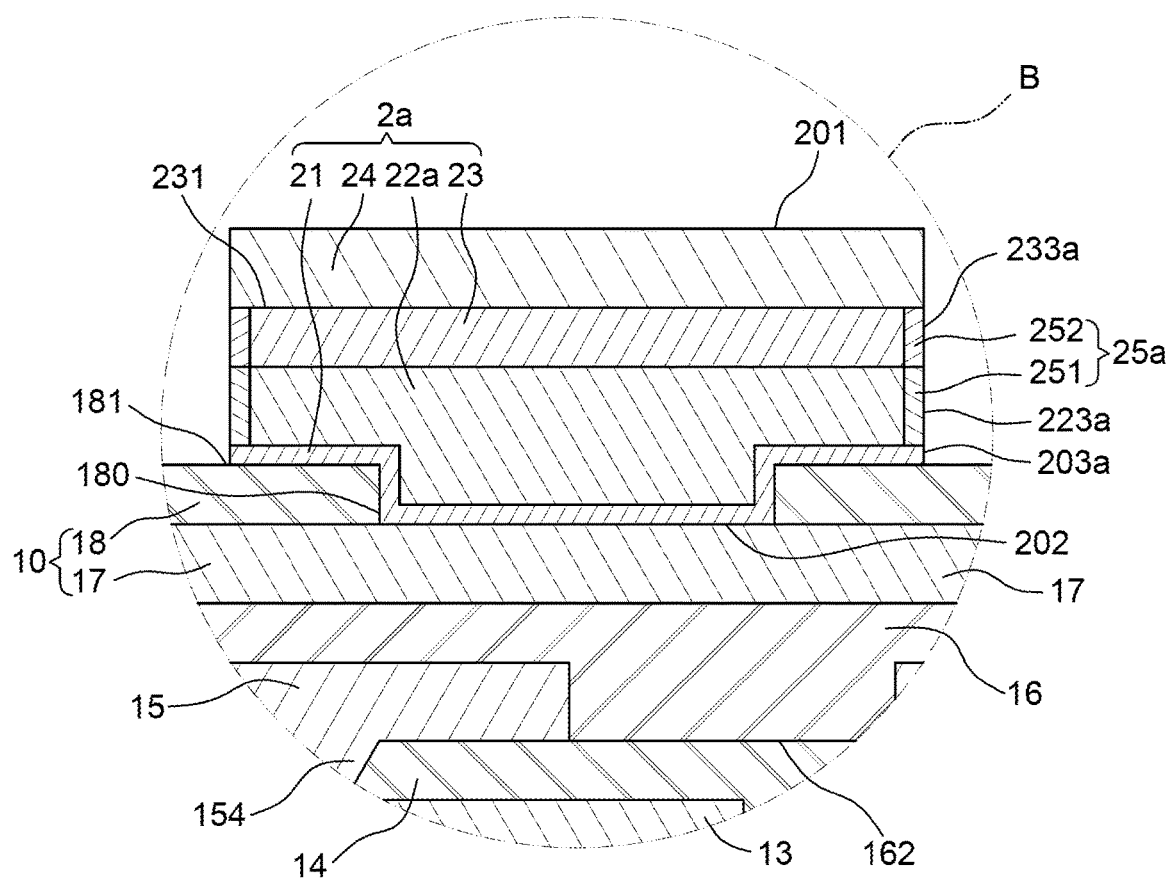
FIG. 4 illustrates an enlarged view of an area "B" shown in FIG. 3.

FIG. 3 illustrates a cross sectional view of an example of a wiring structure 1a according to some embodiments of the present disclosure. FIG. 4 illustrates an enlarged view of an area "B" shown in FIG. 3. The wiring structure 1a is similar to the wiring structure 1 shown in FIGS. 1 and 2, except for the electrical pad 2a.

The electrical pad 2a also includes a seed layer 21, a conductive layer 22a, a barrier layer 23 and an anti-oxidation layer 24. The seed layer 21, the conductive layer 22a, the barrier layer 23 and the anti-oxidation layer 24 of the electrical pad 2a are similar to the seed layer 21, the conductive layer 22, the barrier layer 23 and the anti-oxidation layer 24 of the electrical pad 2 in the wiring structure 1 shown in FIGS. 1 and 2, respectively. However, as shown in FIGS. 3 and 4, a maximum width of the conductive layer 22a is substantially equal to a maximum width of the barrier layer 23. A lateral surface 223a of the conductive layer 22a is continuous or coplanar with a lateral surface 233 of the barrier layer 23. That is, the lateral surface 223a of the conductive layer 22a is substantially coplanar with the lateral surface 233a of the barrier layer 23a. The electrical pad 2a also includes an oxide layer 25a similar to the oxide layer 25 of the electrical pad 2 in the wiring structure 1 shown in FIGS. 1 and 2. However, since the lateral surface 223a of the conductive layer 22a is continuous with a lateral surface 233 of the barrier layer 23, the first portion 251 substantially aligns with the second portion 252.

Figure 5:
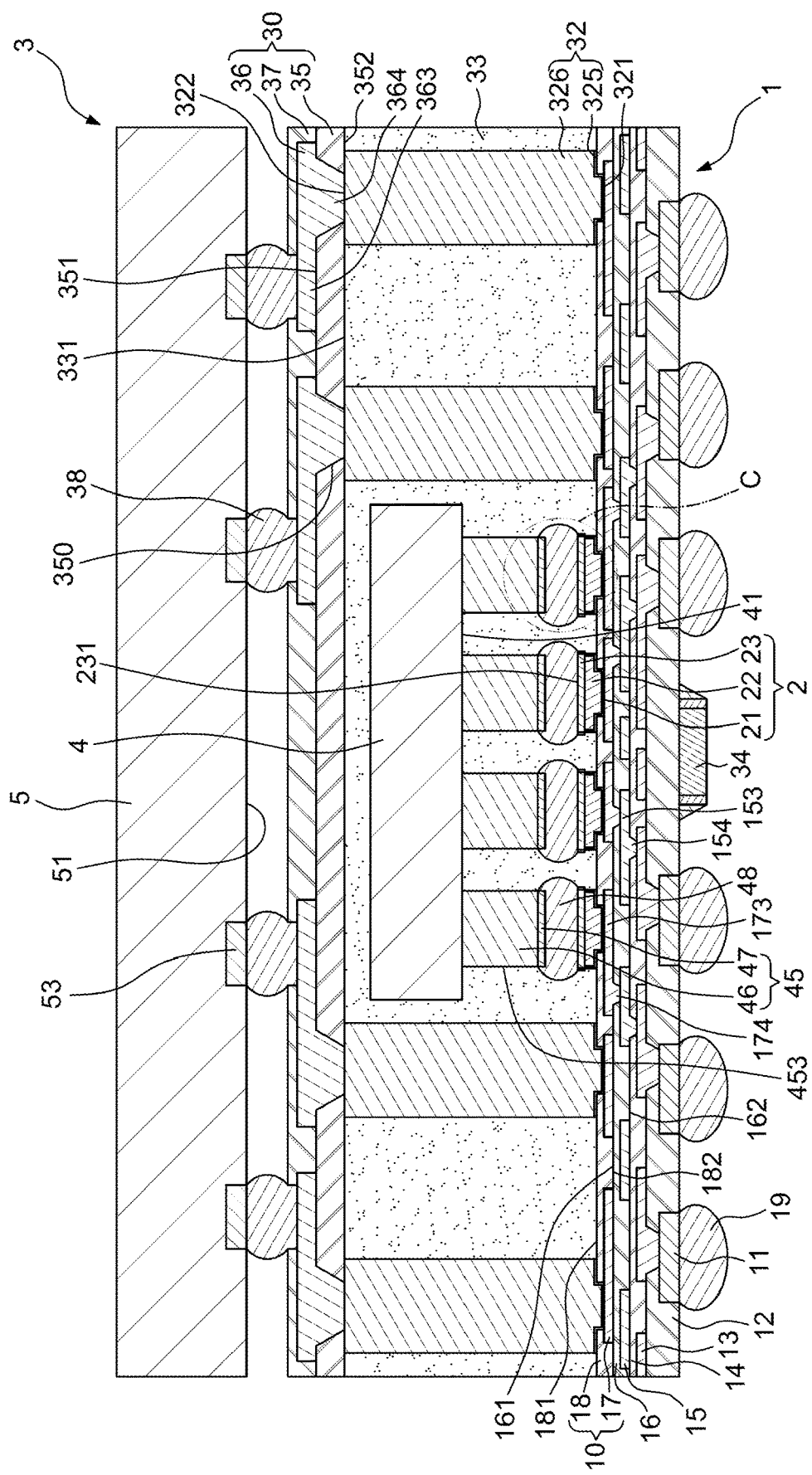
FIG. 5 illustrates a cross sectional view of an example of a semiconductor device structure according to some embodiments of the present disclosure.
Figure 6:
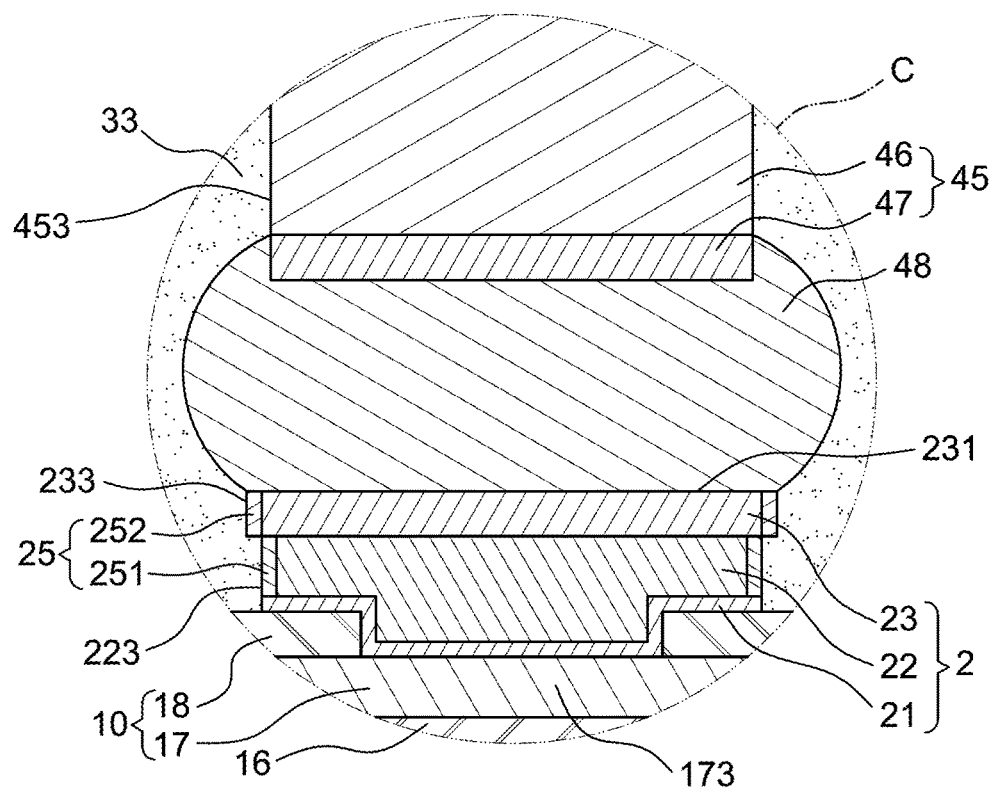
FIG. 6 illustrates an enlarged view of an area "C" shown in FIG. 3.

FIG. 5 illustrates a cross sectional view of a semiconductor device structure 3 according to some embodiments of the present disclosure. FIG. 6 illustrates an enlarged view of an area "C" shown in FIG. 5. The semiconductor device structure 3 includes a first redistribution layer 10 (e.g., including a passivation layer 18 and a metal layer 17), an electrical pad 2, a first electronic component 34, a semiconductor die 4, an internal connector 48, at least one first conductive post 32, an encapsulant 33, a second redistribution layer 30 (e.g., including a lower passivation layer 35, a metal layer 36 and an upper passivation layer 37), an external connector 38 and a second electronic component 5. The semiconductor device structure 3 may further include a plurality of circuit layers, such as a first circuit layer (e.g., including a passivation layer 12 and a metal layer 11), a second circuit layer (e.g., including a passivation layer 14 and a metal layer 13), and a third circuit layer (e.g., including a passivation layer 16 and a metal layer 15).

The first redistribution layer 10 (e.g., including a passivation layer 18 and a metal layer 17), the first circuit layer (e.g., including a passivation layer 12 and a metal layer 11), the second circuit layer (e.g., including a passivation layer 14 and a metal layer 13), and the third circuit layer (e.g., including a passivation layer 16 and a metal layer 15) of the semiconductor device structure 3 are similar to those of the wiring structure 1 shown in FIGS. 1 and 2, thus are not repeat redundantly hereinafter.

Figure 7:
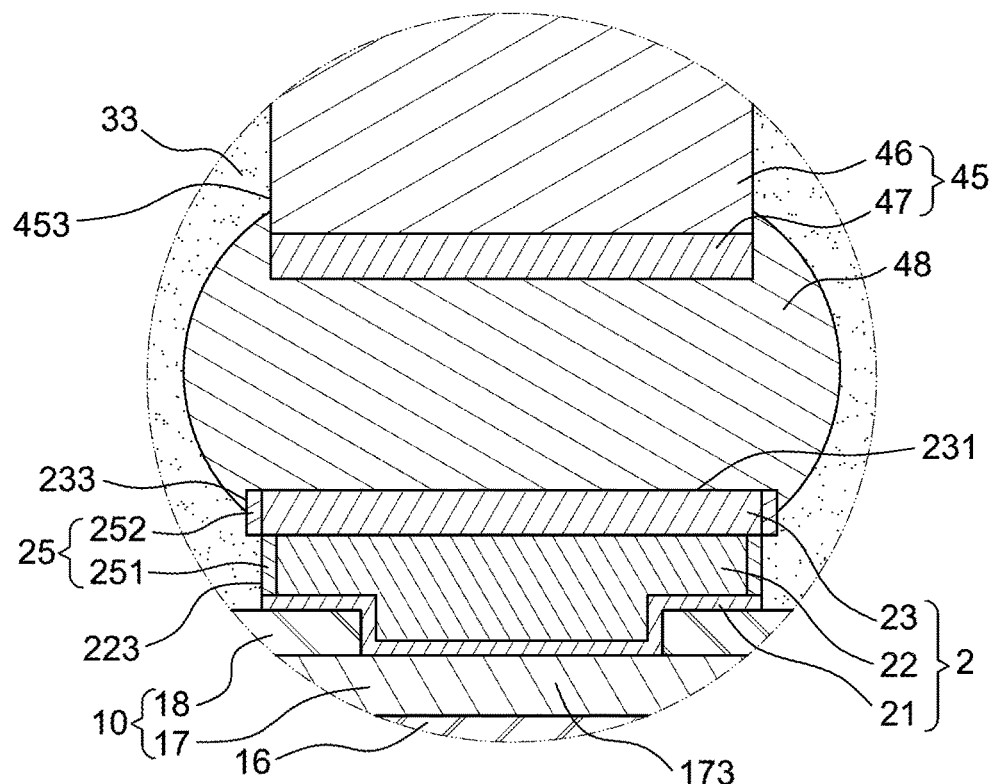
FIG. 7 illustrates a cross sectional view of an example of a portion of a semiconductor device structure according to some embodiments of the present disclosure.

The electrical pad 2 of the semiconductor device structure 3 is also similar to that of the wiring structure 1 shown in FIGS. 1 and 2, except that the anti-oxidation layer 24 of the electrical pad 2 of the semiconductor device structure 3 is fused with a pre-solder (e.g., pre-solder 49 shown in FIG. 21) of the semiconductor die 4 to form an internal connector 48. The internal connector 48 is disposed on and contacts the upper surface 231 of the barrier layer 23, without contacting the conductive layer 22. In other embodiments, the internal connector 48 may further contact the lateral surface 233 of the barrier layer 23 (as shown in FIG. 7).

The first electronic component 34 is disposed on and connected to the bottommost circuit layer of the wiring structure 1, such as the first circuit layer (e.g., including the passivation layer 12 and the metal layer 11). In some embodiments, the first electronic component 34 may be a passive component.

The semiconductor die 4 is disposed on the first redistribution layer 10 (e.g., including the passivation layer 18 and the metal layer 17), and electrically connects to the electrical pad 2. The semiconductor die 4 has a first surface 41, which may be an active surface. As shown in FIG. 5, the semiconductor die 4 includes at least one second conductive post 45 disposed on the first surface 41. The semiconductor die 4 may further include a pre-solder (e.g., pre-solder 49 shown in FIG. 21) disposed on the second conductive post 45, and the pre-solder may be fused with the anti-oxidation layer 24 of the electrical pad 2 to form the internal connector 48. The second conductive post 45 is connected to the electrical pad 2 through the internal connector 48. In some embodiments, a width of the second conductive post 45 may be equal to or less than the maximum width of the barrier layer 22. For example, the maximum width of the barrier layer 22 may be about 1.1 times the width of the second conductive post 45. In some embodiments, the second conductive post 45 includes a conductive section 46 and a barrier section 47. The conductive section 46 connects to the first surface 41 of the semiconductor die 4, and the barrier section 47 connects to the conductive section 46. A material of the conductive section 46 may include copper, another conductive metal, or an alloy thereof. A material of the barrier section 47 may include nickel. The barrier section 47 may prevent or reduce diffusion of the material of the conductive section 46, such as copper, into the internal connector 48. The second conductive post 45 has a lateral surface 453, and the internal connector 48 contacts the lateral surface 453 of the second conductive post 45. As shown in FIGS. 5 and 6, the internal connector 48 contacts merely the barrier section 47 of the conductive post 45. However, in other embodiments, the internal connector 48 may contact the barrier section 47 and a small portion of the conductive section 46 of the second conductive post 45 (as shown in FIG. 7). A material of the internal connector 48 may include a solder material, such as tin, silver, or an alloy of tin and/or silver. In some embodiments, the material of the internal connector 48 may further include a small amount of IMC made of $(Cu,Ni)_6Sn_5$. Such IMC made of $(Cu,Ni)_6Sn_5$ including nickel may provide a mechanical strength greater than the IMC made of $Cu_6Sn_5$ and/or $Cu_3Sn$ including merely copper and tin.

The first conductive post 32 is disposed on the first redistribution layer 10 (e.g., including the passivation layer 18 and the metal layer 17), and adjacent to the semiconductor die 4. In one embodiment, the semiconductor device structure 3 includes a plurality of first conductive posts 32 surrounding the semiconductor die 4. In some embodiments, the first conductive post 32 is disposed on and contacts another conductive pad 173 of the metal layer 17 of the first redistribution layer 10. The first conductive post 32 may include a seed layer 325 and a conductive section 326. The seed layer 325 is disposed on and contacts the metal layer 17 and the passivation layer 18 of the first redistribution layer 10, and the conductive section 326 is disposed on and contacts the seed layer 325. A material of the seed layer 325 may include titanium and/or copper. In some embodiments, the seed layer 325 includes a titanium layer and a copper layer sequentially disposed on the first redistribution layer 10. The seed layer 325 of the first conductive post 32 may be formed concurrently with the seed layer 21 of the electrical pad 2. Accordingly, the thickness and the composition of the seed layer 325 of the first conductive post 32 may be substantially the same as those of the seed layer 21 of the electrical pad 2. A material of the conductive section 326 may include copper, another conductive metal, or an alloy thereof.

The first conductive post 32 may have a first end 321 and a second end 322 opposite to the first end 321. The seed layer 325 is adjacent to the first end 321. The first end 321 connects and contacts the metal layer 17 of the first redistribution layer 10.

The encapsulant 33 is disposed on the first redistribution layer 10, such as on the passivation layer 18 of the first redistribution layer 10, and covers the semiconductor die 4 and the first conductive post 32. A material of the encapsulant 33 may be a molding compound or an underfill, and may be with or without fillers. In some embodiments, the encapsulant 33 may encapsulate the entire semiconductor die 4, and may surround the second conductive post 45 and the electrical pad 2. The second end 322 of the first conductive post 32 may be exposed from the encapsulant 33. As shown in FIG. 5, the second end 322 of the first conductive post 32 may be substantially coplanar with an upper surface 331 of the encapsulant 33.

The second redistribution layer 30 is disposed on the encapsulant 33 and electrically connects to the first conductive post 32. The second redistribution layer 30 may include the lower passivation layer 35, the metal layer 36 and the upper passivation layer 37. As shown in FIG. 5, the lower passivation layer 35 is disposed on the upper surface 331 of the encapsulant 33. The lower passivation layer 35 has an upper surface 351 and a lower surface 352 opposite to the upper surface 351. The lower surface 352 contacts the upper surface 331 of the encapsulant 33. The lower passivation layer 35 defines an opening 350 extending through the lower passivation layer 35. The opening 350 exposes at least a portion of the second end 322 of the first conductive post 32.

The metal layer 36 is disposed on the upper surface 352 and in the opening 350 of the lower passivation layer 35. For example, the metal layer 36 may include a bonding pad 363, a conductive via 364 and a trace (not shown). The conductive pad 363 and the trace (not shown) may be disposed on the upper surface 351 of the lower passivation layer 35. The conductive via 364 is disposed in the opening 350 of the lower passivation layer 35 and electrically connects to the second end 322 of the first conductive post 32.

The upper passivation layer 37 is disposed on the lower passivation layer 35 and on the metal layer 36. As shown in FIG. 5, the upper passivation layer 37 is disposed on the upper surface 352 of the lower passivation layer 35, and covers the metal layer 36. The upper passivation layer 37 may expose a portion of the metal layer 36, such as the bonding pad 363 of the metal layer 36, for external connection. A thickness of the lower passivation layer 35 may be about 18 µm, a thickness of the metal layer 36 may be about 12 µm, and a thickness of the upper passivation layer 37 may be about 18 µm.

In some embodiments, an external connector 38 is disposed on the bonding pad 363 of the metal layer 36 of the second redistribution layer 30. The external connector 38 may further contact and connect to a second electronic component 5. The second electronic component 5 may be a random access memory (RAM). The second electronic component 5 has a lower surface 51 faces the second redistribution layer 30, and may include a conductive pad 53 exposed from the lower surface 51. The external connector 38 connects between the bonding pad 363 of the metal layer 36 and the conductive pad 53 of the second electronic component 5.

FIG. 7 illustrates a cross sectional view of an example of a portion of a semiconductor device structure according to some embodiments of the present disclosure. The semiconductor device structure shown in FIG. 7 is similar to the semiconductor device structure 3 shown in FIGS. 5 and 6. However, as shown in FIG. 7, the internal connector 48 further contacts the lateral surface 233 of the barrier layer 23, and a small portion of the conductive section 46 of the second conductive post 45.

FIG. 8 through FIG. 37 illustrate a method for manufacturing a semiconductor device structure according to some embodiments of the present disclosure. In some embodiments, the method is for manufacturing the wiring structure 1 shown in FIGS. 1 and 2, the wiring structure 1*a* shown in FIGS. 3 and 4, and/or the semiconductor device structure 3 shown in FIGS. 5 and 6.

Figure 8:
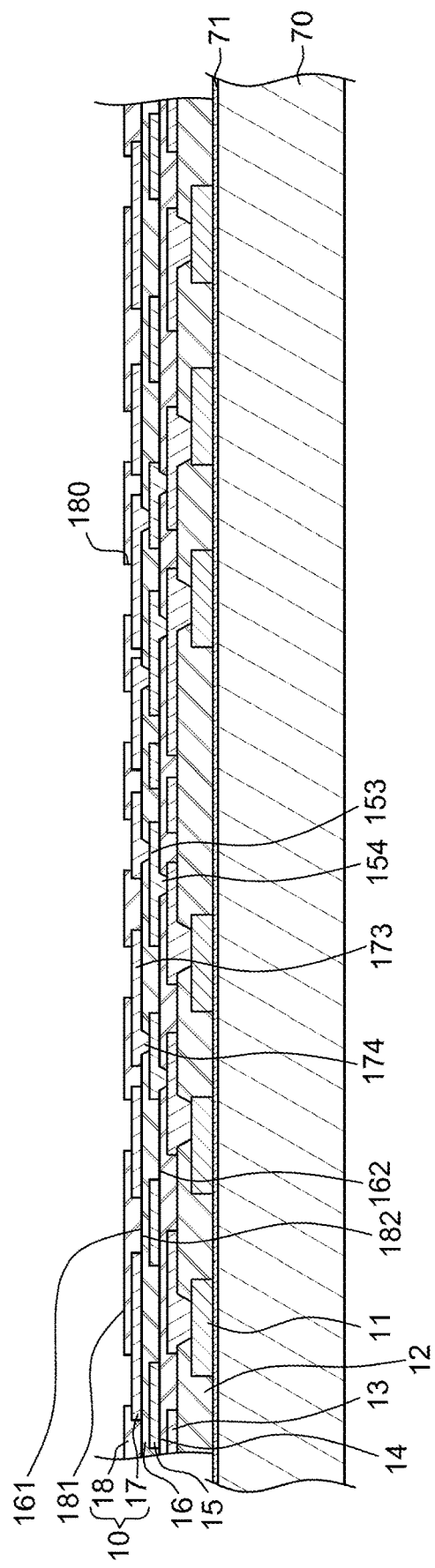
FIG. 8 illustrates one or more stages of an example of a method for manufacturing a semiconductor device structure according to some embodiments of the present disclosure.

Referring to FIG. 8, a first carrier 70 is provided, and a seed layer 71 is formed or disposed thereon. Then, a first circuit layer (e.g., including a passivation layer 12 and a metal layer 11), a second circuit layer (e.g., including a passivation layer 14 and a metal layer 13), and a third circuit layer (e.g., including a passivation layer 16 and a metal layer 15) are sequentially formed or disposed on the seed layer 71 by any process known in the technical field. For example, the metal layer 11 of the first circuit layer may be formed on the seed layer 71 by plating in a patterned photoresist layer. A material of the metal layer 11 may include copper, another conductive metal, or an alloy thereof. After the patterned photoresist layer is removed, the passivation layer 12 of the first circuit layer may be formed on the seed layer 71 to cover the metal layer 11. A material of the passivation layer 12 may include an insulating material, a dielectric material or a solder resist material, such as, for example, benzocyclobutene (BCB) based polymer or a polyimide (PI). The material of the passivation layer 12 may include cured photoimageable dielectric (PID) materials, such as an epoxy or a PI including photoinitiators, or other resin materials. Then, a laser drilling process or a patterning process may be conducted to the passivation layer 12 to expose a portion of the metal layer 11, thus forming the first circuit layer.

The second circuit layer and the third circuit layer may be formed by similar process and using similar materials as the first circuit layer. For example, the metal layer 15 of the third circuit layer may be formed on the second circuit layer. The metal layer 15 may include a conductive pad 153, a conductive via 154 and a trace (not shown). Then, the passivation layer 16 may be formed on the second circuit layer to cover the metal layer 15. The passivation layer 16 may have an upper surface 161, and a lower surface 162 opposite to the upper surface 161. The metal layer 15 is disposed adjacent to the lower surface 162. The passivation layer 16 exposes a portion of the metal layer 15, such as the conductive pad 153 of the metal layer 15.

Then, a first redistribution layer 10 (e.g., including a passivation layer 18 and a metal layer 17) is formed on the third circuit layer, such as the passivation layer 16 of the third circuit layer. The first redistribution layer 10 may also be formed by similar processes and using similar materials as the first circuit layer. For example, the metal layer 17 may be formed on the passivation layer 16 of the third circuit layer. The metal layer 17 may include a conductive pad 173, a conductive via 174 and a trace (not shown). The conductive via 174 extends through the passivation layer 16 to contact and connect to the metal layer 15 of the third circuit layer, such as the conductive pad 153 of the metal layer 15. Then, the passivation layer 18 of the first redistribution layer 10 may be formed on the third circuit layer to cover the metal layer 17. The passivation layer 18 has an upper surface 181, and a lower surface 182 opposite to the upper surface 181. The metal layer 17 is disposed adjacent to the lower surface 182. The passivation layer 18 defines an opening 180 extending through the passivation layer 18. The opening 180 exposes a portion of the metal layer 17, such as the conductive pad 173 of the metal layer 17.

Figure 9:
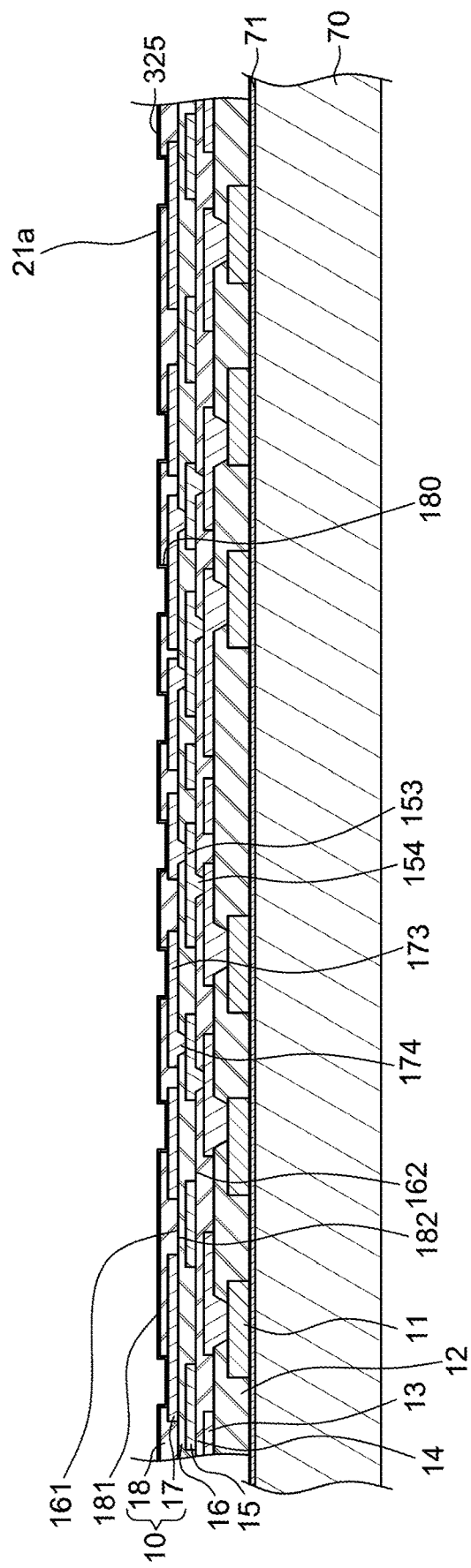
FIG. 9 illustrates one or more stages of an example of a method for manufacturing a semiconductor device structure according to some embodiments of the present disclosure.

Referring to FIG. 9, a seed layer 21a is formed on the first redistribution layer 10, such as formed on the upper surface 181 and in the opening 180 of the passivation layer 18. The seed layer 21a may contact and connect to the conductive pad 173 of the metal layer 17 of the first redistribution layer 10. A material of the seed layer 21a may include titanium and/or copper. In some embodiments, the seed layer 21a includes a titanium layer and a copper layer sequentially disposed on the passivation layer 18.

Figure 10:
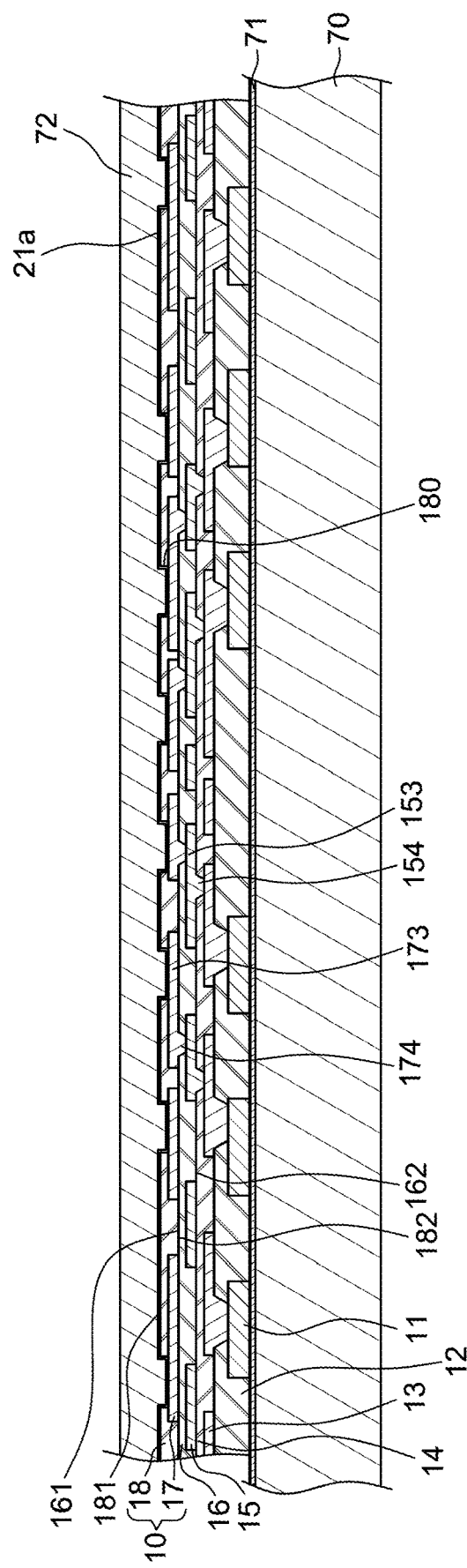
FIG. 10 illustrates one or more stages of an example of a method for manufacturing a semiconductor device structure according to some embodiments of the present disclosure.

Referring to FIG. 10, a first photoresist layer 72 is formed or disposed on the seed layer 21a on the first redistribution layer 10, such as the passivation layer 18 of the first redistribution layer 10. The first photoresist layer 72 may be a dry film which can be directly disposed on the first redistribution layer 10, or may be applied in a liquid form.

Figure 11:
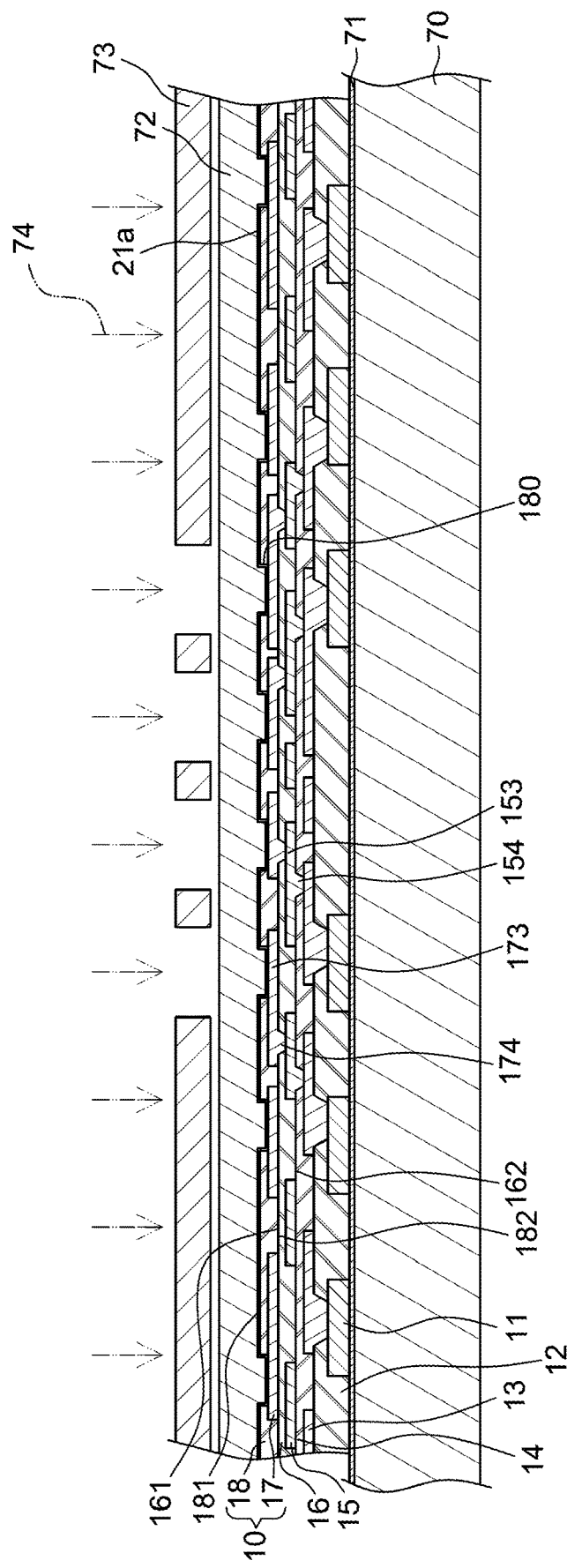
FIG. 11 illustrates one or more stages of an example of a method for manufacturing a semiconductor device structure according to some embodiments of the present disclosure.

Referring to FIG. 11, the first photoresist layer 72 is exposed to a pattern of intense light. For example, a photomask 73 is disposed adjacent to the first photoresist layer 72, so as to cover a portion of the first photoresist layer 72. Then, the first photoresist material 72 is exposed to a radiation source 74.

Figure 12:
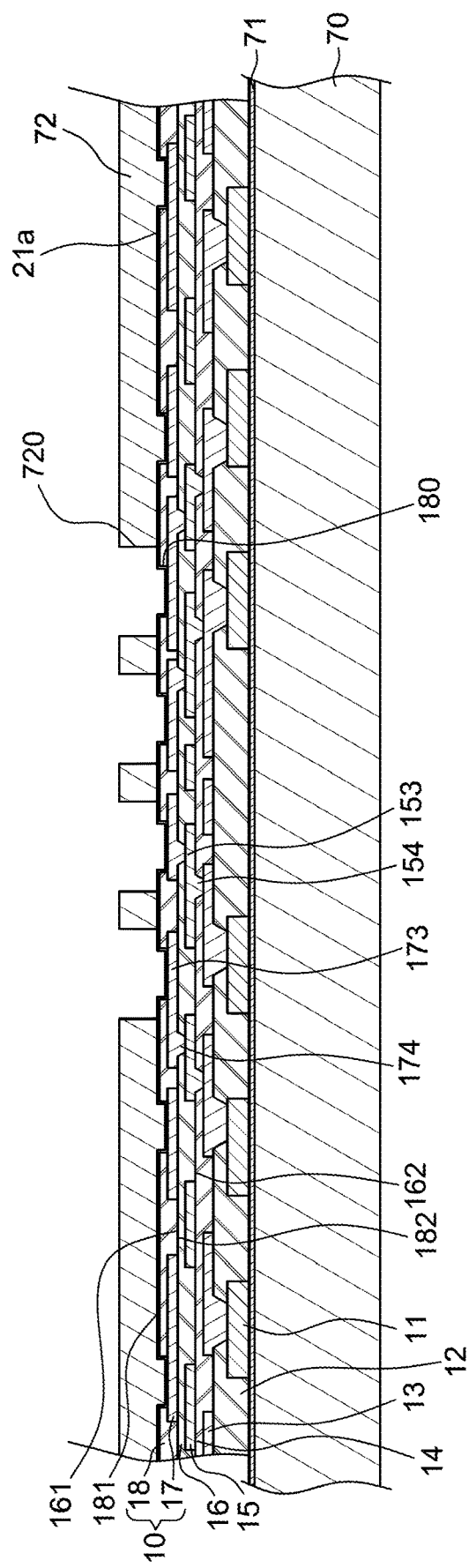
FIG. 12 illustrates one or more stages of an example of a method for manufacturing a semiconductor device structure according to some embodiments of the present disclosure.

Referring to FIG. 12, the first photoresist layer 72 is then developed by a developer. That is, the first photoresist layer 72 is patterned to define at least one through hole 720, which exposes at least a portion of the seed layer 21a. For example, a portion of the seed layer 21a disposed in the opening 180 of the passivation layer 18 of the first redistribution layer 10 is exposed.

Figure 13:
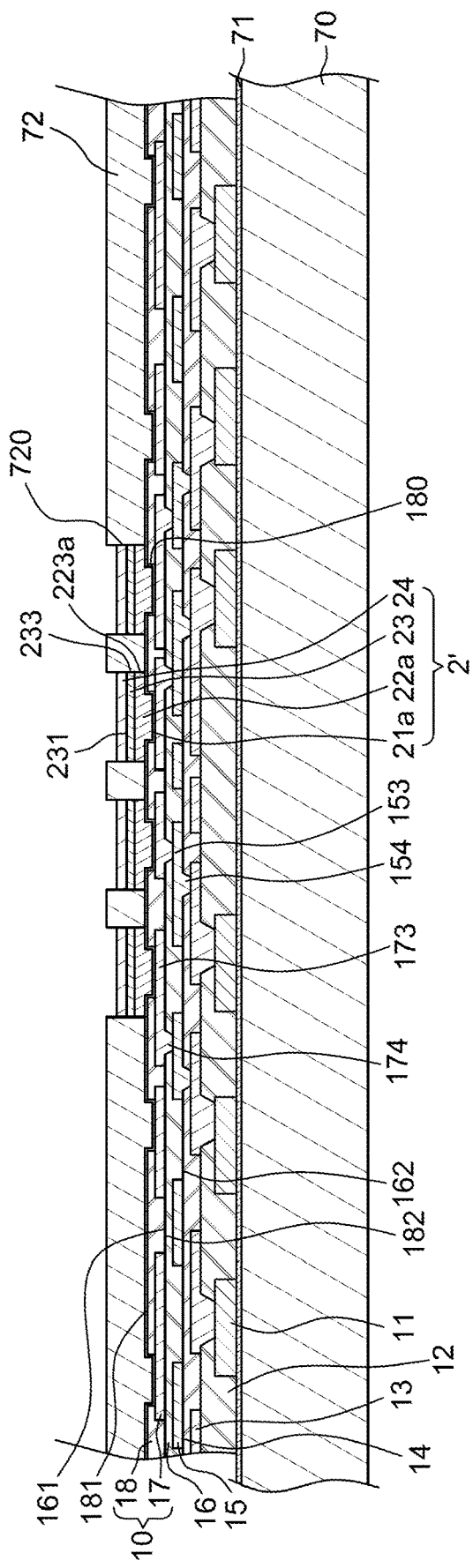
FIG. 13 illustrates one or more stages of an example of a method for manufacturing a semiconductor device structure according to some embodiments of the present disclosure.

Referring to FIG. 13, an electrical pad 2' is then formed on the first redistribution layer 10 and in the through hole 720 of the first photoresist layer 72. For example, the electrical pad 2' includes a portion of the seed layer 21a (e.g., the seed layer 21 shown in FIGS. 1 and 2), a conductive layer 22a, a barrier layer 23 and an anti-oxidation layer 24 sequentially formed in the through hole 720 of the first photoresist layer 72.

The conductive layer 22a is formed on the seed layer 21a by, for example, plating. A material of the conductive layer 22a may include copper, another conductive metal, or an alloy thereof. The conductive layer 22a has a lateral surface 223a contacting the through hole 720 of the first photoresist layer 72. A maximum width of the conductive layer 22a may be about 60 μm. A minimum width of the conductive layer 22a may be about 30 μm. A maximum thickness of the conductive layer 22a may be about 10 μm, and a minimum thickness of the conductive layer 22a may be about 7 μm.

The barrier layer 23 is formed on the conductive layer 22a by, for example, plating. A material of the barrier layer 23 may include nickel. The barrier layer 23 has a lateral surface 233 contacting the through hole 720 of the first photoresist layer 72. A maximum width of the barrier layer 23 may be about 60 μm. The lateral surface 223a of the conductive layer 22a may be continuous with the lateral surface 233 of the barrier layer 23. A thickness of the barrier layer 23 may be about 3 μm. The barrier layer 23 may prevent or reduce diffusion of the material of the conductive layer 22, such as copper, into the anti-oxidation layer 24.

The anti-oxidation layer 24 is formed on an upper surface 231 of the barrier layer 23 by, for example, plating or solder paste printing. A material of the anti-oxidation layer 24 may include a solder material, such as tin, silver, or an alloy of tin and/or silver. The anti-oxidation layer 24 covers the upper surface 231 of the barrier layer 23. A maximum width of the anti-oxidation layer 24 may be about 60 μm. The maximum width of the anti-oxidation layer 24 may be substantially the same as the maximum width of the barrier layer 23. A thickness of the anti-oxidation layer 24 may be about 4 μm.

Figure 14:
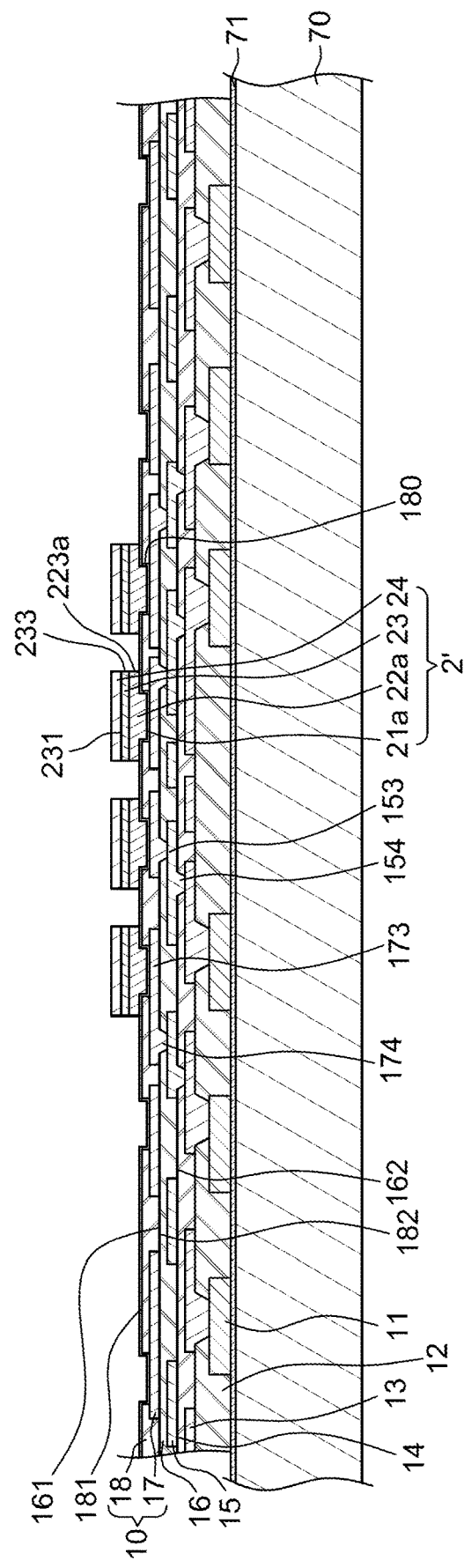
FIG. 14 illustrates one or more stages of an example of a method for manufacturing a semiconductor device structure according to some embodiments of the present disclosure.

Referring to FIG. 14, the first photoresist layer 72 is removed by, for example, stripping.

Figure 15:
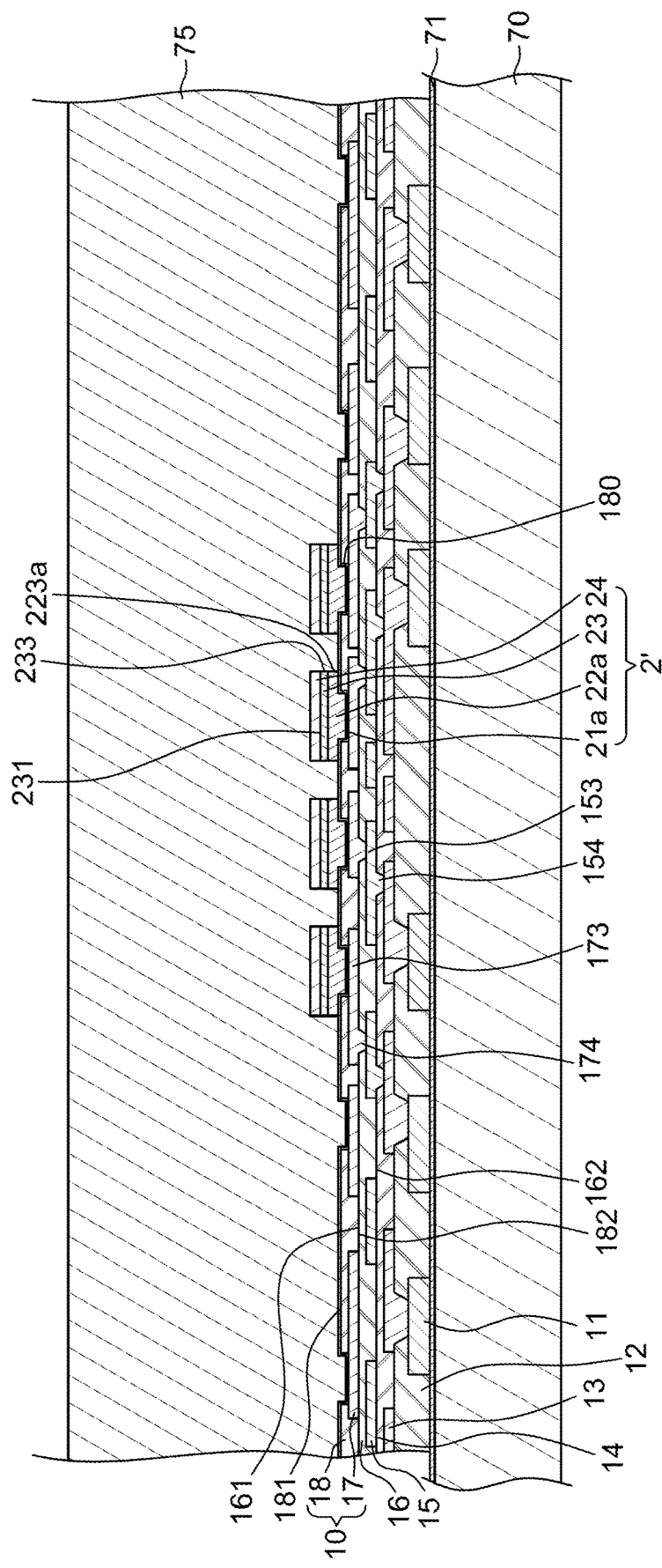
FIG. 15 illustrates one or more stages of an example of a method for manufacturing semiconductor device structure according to some embodiments of the present disclosure.

Referring to FIG. 15, a second photoresist layer 75 is formed or disposed on the seed layer 21a on the first redistribution layer 10, such as the passivation layer 18 of the first redistribution layer 10, and on the electrical pad 2'. The second photoresist layer 75 may be a dry film which can be directly disposed on the first redistribution layer 10. The second photoresist layer 75 may have a thickness much greater than a thickness of the first photoresist layer 72.

Figure 16:
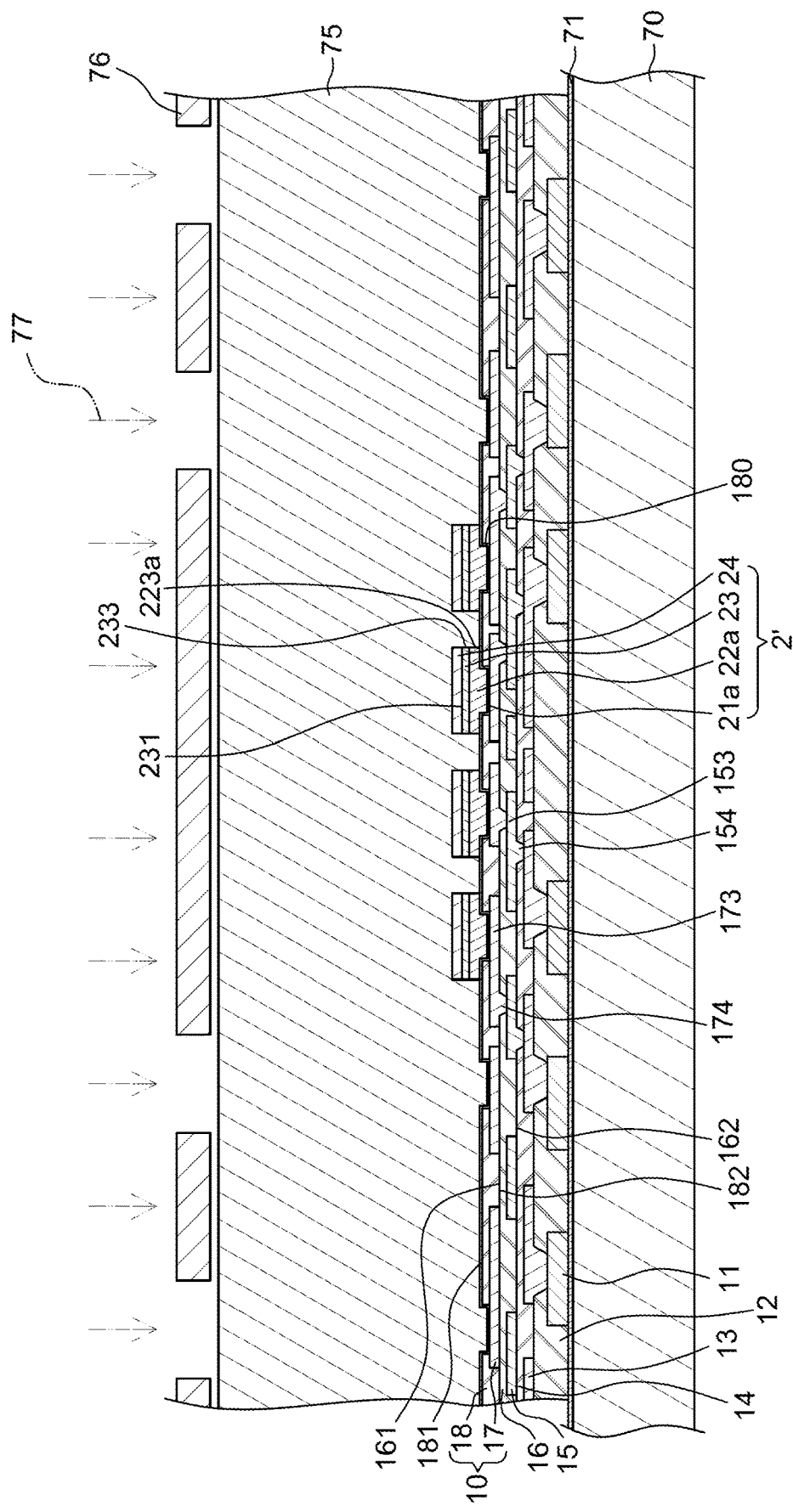
FIG. 16 illustrates one or more stages of an example of a method for manufacturing a semiconductor device structure according to some embodiments of the present disclosure.

Referring to FIG. 16, the second photoresist layer 75 is exposed to a pattern of intense light. For example, a photomask 76 is disposed adjacent to the second photoresist layer 75, so as to cover a portion of the second photoresist layer 75. Then, the second photoresist layer 75 is exposed to a radiation source 77.

Figure 17:
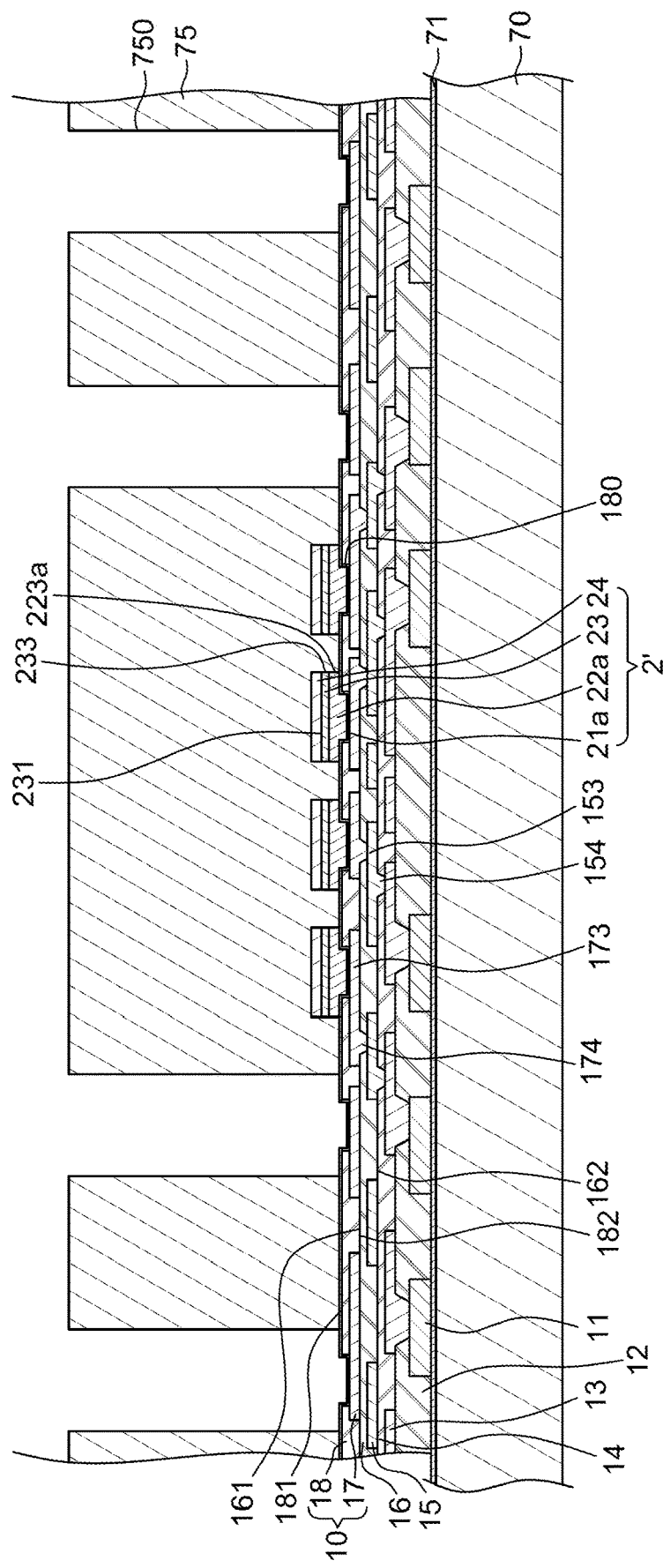
FIG. 17 illustrates one or more stages of an example of a method for manufacturing a semiconductor device structure according to some embodiments of the present disclosure.

Referring to FIG. 17, the second photoresist layer 75 is then developed by a developer. That is, the second photoresist layer 75 is patterned to define at least one through hole 750, which exposes at least a portion of the seed layer 21a. For example, another portion of the seed layer 21a disposed in another opening 180 of the passivation layer 18 of the first redistribution layer 10 is exposed.

Figure 18:
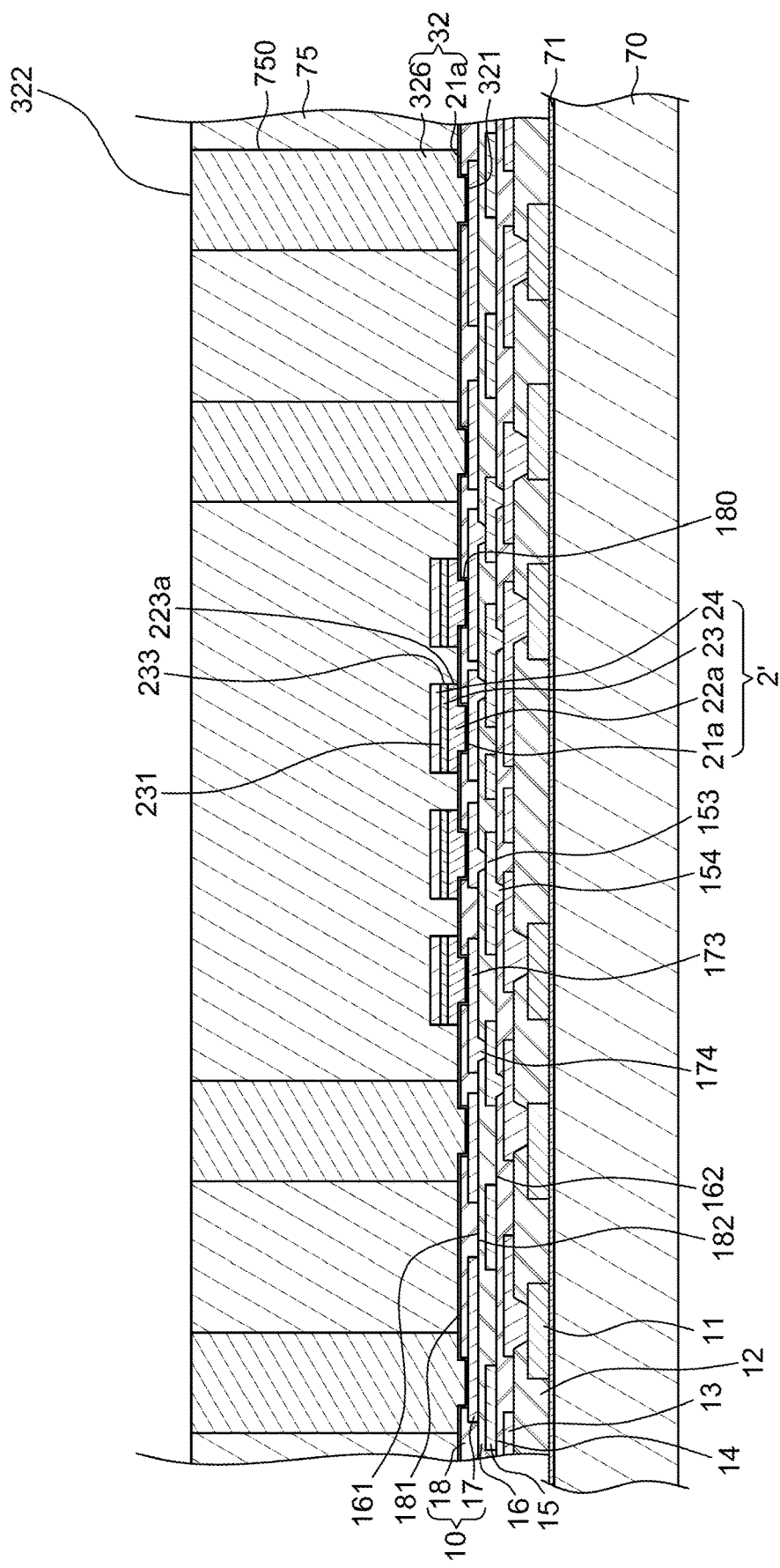
FIG. 18 illustrates one or more stages of an example of a method for manufacturing a semiconductor device structure according to some embodiments of the present disclosure.

Referring to FIG. 18, at least a first conductive post 32 is formed on the first redistribution layer 10 and in the through hole 750 of the second photoresist layer 75. For example, the first conductive post 32 includes a portion of the seed layer 21a (e.g., the seed layer 325 shown in FIGS. 5 and 6) and a conductive section 326. A material of the conductive section 326 may include copper, another conductive metal, or an alloy thereof. The first conductive post 32 may have a first end 321 and a second end 322 opposite to the first end 321. The first end 321 contacts and connects to the metal layer 17 of the first redistribution layer 10. The second end 322 is exposed in the through hole 750 of the second photoresist layer 75.

Figure 19:
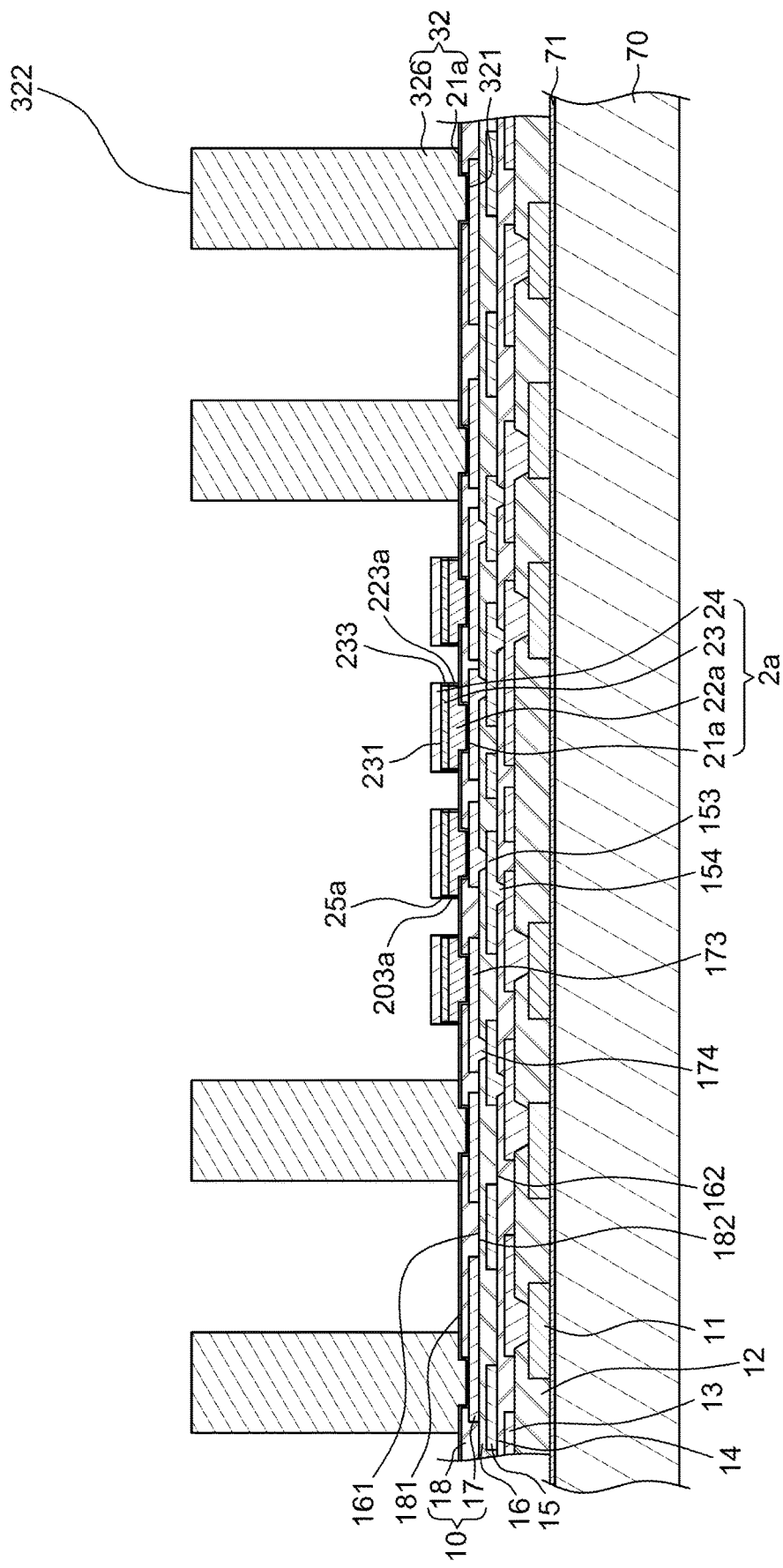
FIG. 19 illustrates one or more stages of an example of a method for manufacturing a semiconductor device structure according to some embodiments of the present disclosure.

Referring to FIG. 19, the second photoresist layer 75 is removed by, for example, stripping. Since the thickness of the second photoresist 75 is greater than the first photoresist 72, stripping process of the second photoresist 75 may involve a higher temperature and a longer processing time, such as a temperature of about 73° C. for about 1 hour. Such stripping process of the second photoresist 75 may result in oxidation of the conductive layer 22a, the barrier layer 23 and/or the anti-oxidation layer 24. For example, peripheral regions of the conductive layer 22a and the barrier layer 23a may readily be oxidized. That is, the operation of removing the second photoresist layer 75 may include forming an oxide layer 25a adjacent to a lateral surface 203a of the electrical pad 2a. However, the upper surface 231 of the barrier layer 23 may not be oxidized since it is covered by the anti-oxidation layer 24.

Figure 20:
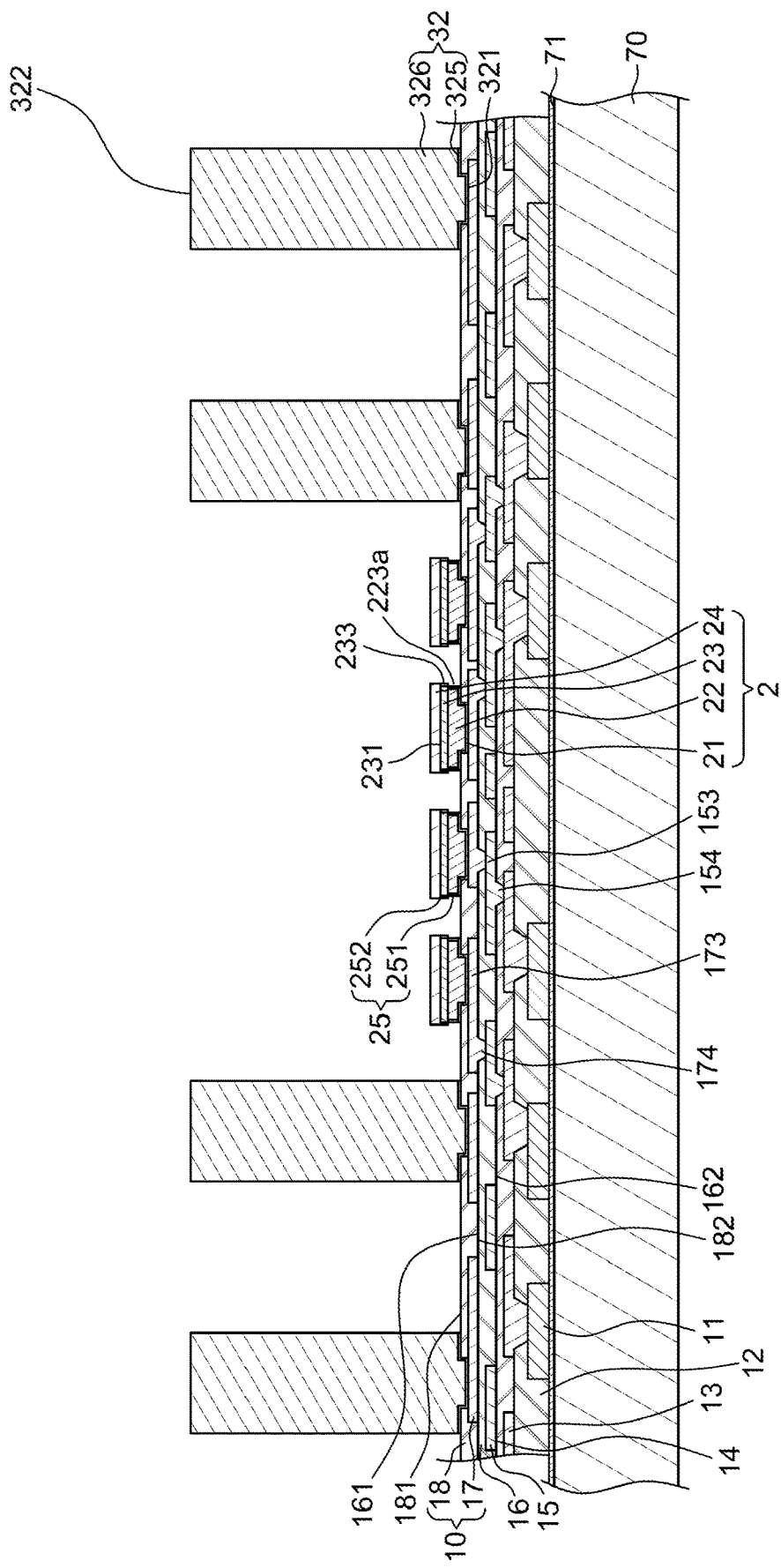
FIG. 20 illustrates one or more stages of an example of a method for manufacturing a semiconductor device structure according to some embodiments of the present disclosure.

Referring to FIG. 20, portions of the seed layer 21a, which are not covered by the conductive layer 22a of the electrical pad 2a or the conductive section 326 of the first conductive post 32, are removed by, for example, etching. A peripheral region of the conductive layer 22a (e.g., with a thickness of about 1 μm to about 2 μm) may also be removed during the etching process, thus forming a conductive layer 22 having a reduced maximum width (as shown in FIGS. 1 and 2, or FIGS. 5 and 6). Meanwhile, the electrical pad 2a becomes the electrical pad 2. Accordingly, the maximum width of the conductive layer 22 may be less than the maximum width of the barrier layer 23, such as about 1 μm to about 2 μm less at each side. That is, the lateral surface 223 of the conductive layer 22 may be located within the lateral surface 233 of the barrier layer 23. Besides, peripheral regions of the conductive layer 22 and the barrier layer 23 may further be oxidized during such etching process, forming the oxide layer 25. The oxide layer 25 may include a first portion 251 disposed adjacent to the lateral surface 223 of the conductive layer 22, and a second portion 252 disposed adjacent to the lateral surface 233 of the barrier layer 23. The first portion 251 of the oxide layer 25 may include copper oxide, and the second portion 252 of the oxide layer 25 may include nickel oxide. In some embodiments, the seed layer 21 and/or the anti-oxidation layer 24 may also include oxidation layer or oxidation region. In other embodiments, the peripheral region of the conductive layer 22a may not be removed during the etching process, thus having the maximum width substantially equal to the maximum width of the barrier layer 23 (as shown in FIGS. 3 and 4).

Figure 21:
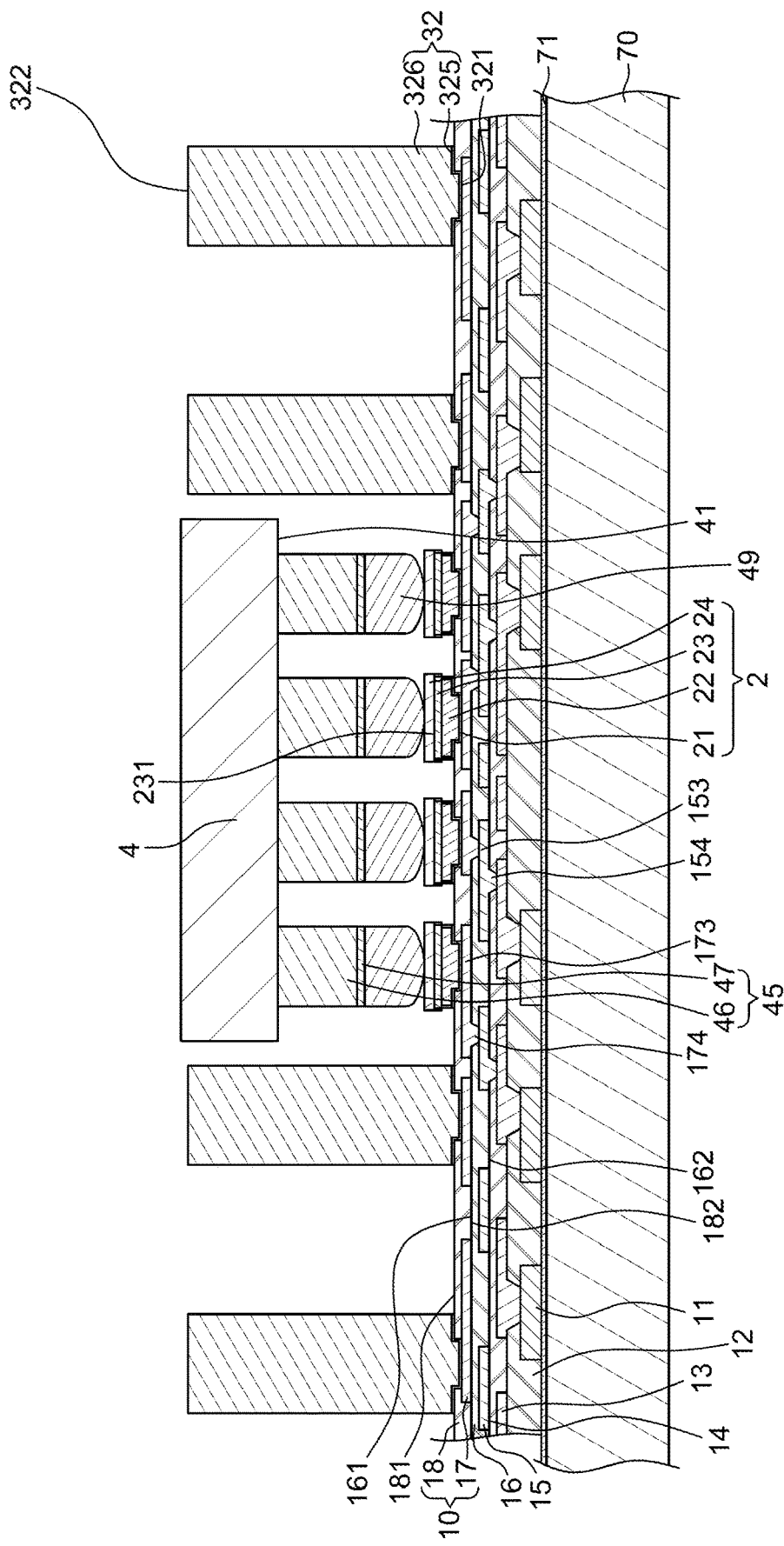
FIG. 21 illustrates one or more stages of an example of a method for manufacturing a semiconductor device structure according to some embodiments of the present disclosure.

Referring to FIG. 21, a semiconductor die 4 is disposed on the first redistribution layer 10 (e.g., including the passivation 18 and the metal layer 17). The semiconductor die 4 has a first surface 41, which may be an active surface. As shown in FIG. 21, the semiconductor die 4 includes a second conductive post 45 disposed on the first surface 41. The second conductive post 45 includes a conductive section 46 and a barrier section 47. The conductive section 46 connects to the first surface 41 of the semiconductor die 4, and the barrier section 47 connects to the conductive section 46. A material of the conductive section 46 may include copper, another conductive metal, or an alloy thereof. A material of the barrier section 47 may include nickel. The semiconductor die 4 may further include a pre-solder 49 disposed on the second conductive post 45, such as the barrier section 47 of the second conductive post 45. A material of the pre-solder 49 may include a solder material, such as tin, silver, or an alloy of tin and/or silver. The pre-solder 49 contacts the anti-oxidation layer 24 of the electrical pad 2. The barrier section 47 may prevent or reduce diffusion of the material of the conductive section 46, such as copper, into the pre-solder 49.

Figure 22:
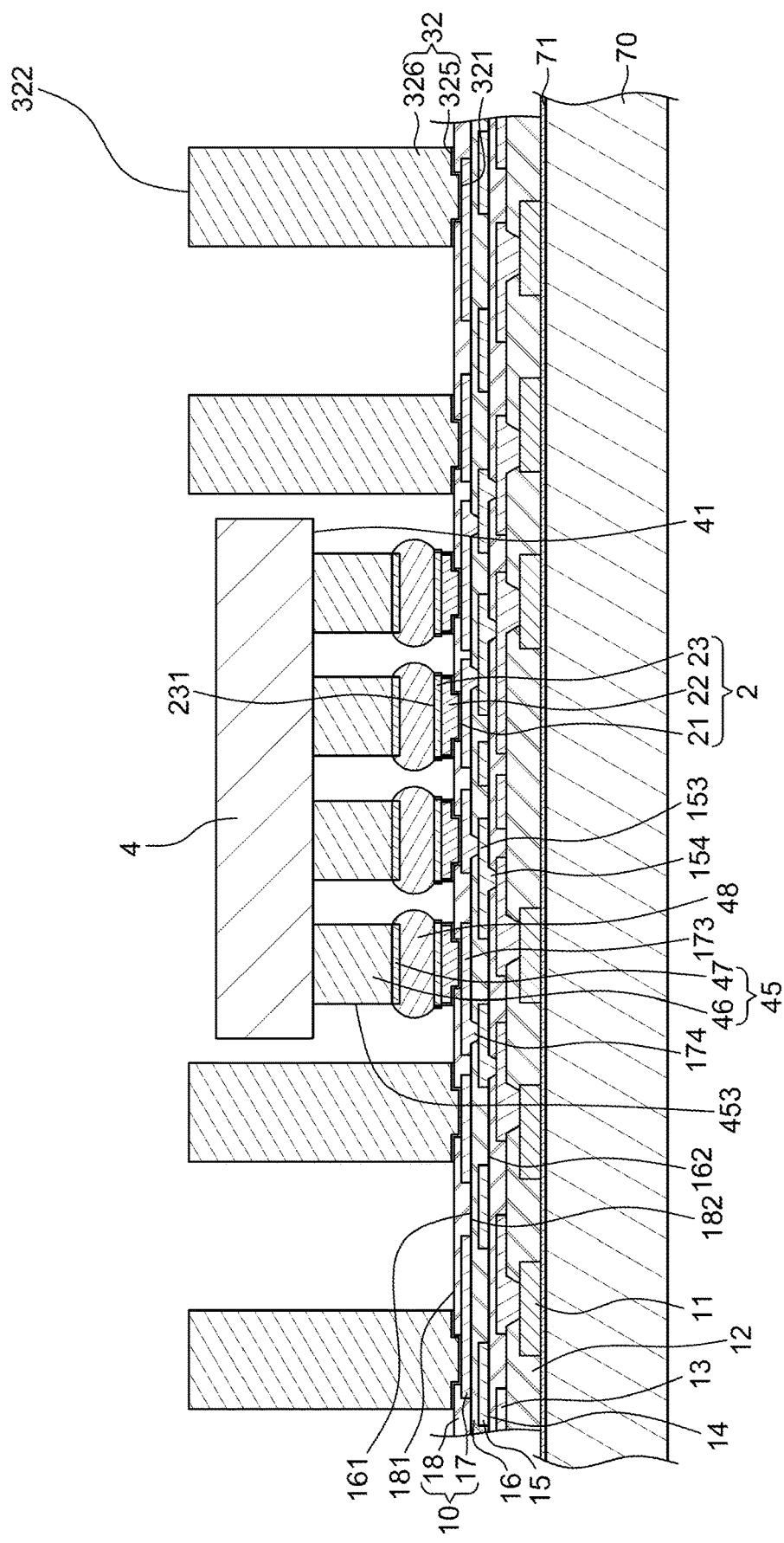
FIG. 22 illustrates one or more stages of an example of a method for manufacturing a semiconductor device structure according to some embodiments of the present disclosure.

Referring to FIG. 22, the pre-solder 49 of the semiconductor die 4 is fused with the anti-oxidation layer 24 of the electrical pad 2' by, for example, a reflowing process, to form an internal connector 48. Accordingly, the semiconductor die 4 electrically connects to the electrical pad 2 through the internal connector 48. During the reflowing process, since the maximum width of the conductive layer 22 is less than the maximum width of the barrier layer 23, and since the oxide layer 25 is formed adjacent to the lateral surface 203 of the electrical pad 2, the molten pre-solder 49 and anti-oxidation layer 24 can be retained on the barrier layer 23 without flowing down to contact the conductive layer 22. However, in other embodiments, the internal connector 48 may further contact the lateral surface 233 of the barrier layer 23 (as shown in FIG. 7). The second conductive post 45 has a lateral surface 453, and the internal connector 48 may contact and flow upward along the lateral surface 453 of the second conductive post 45. As shown in FIG. 22, the internal connector 48 contacts merely the barrier section 47 of the conductive post 45. However, in other embodiments, the internal connector 48 may contact both the barrier section 47 and the conductive section 46 of the second conductive post 45 (as shown in FIG. 7).

Figure 23:
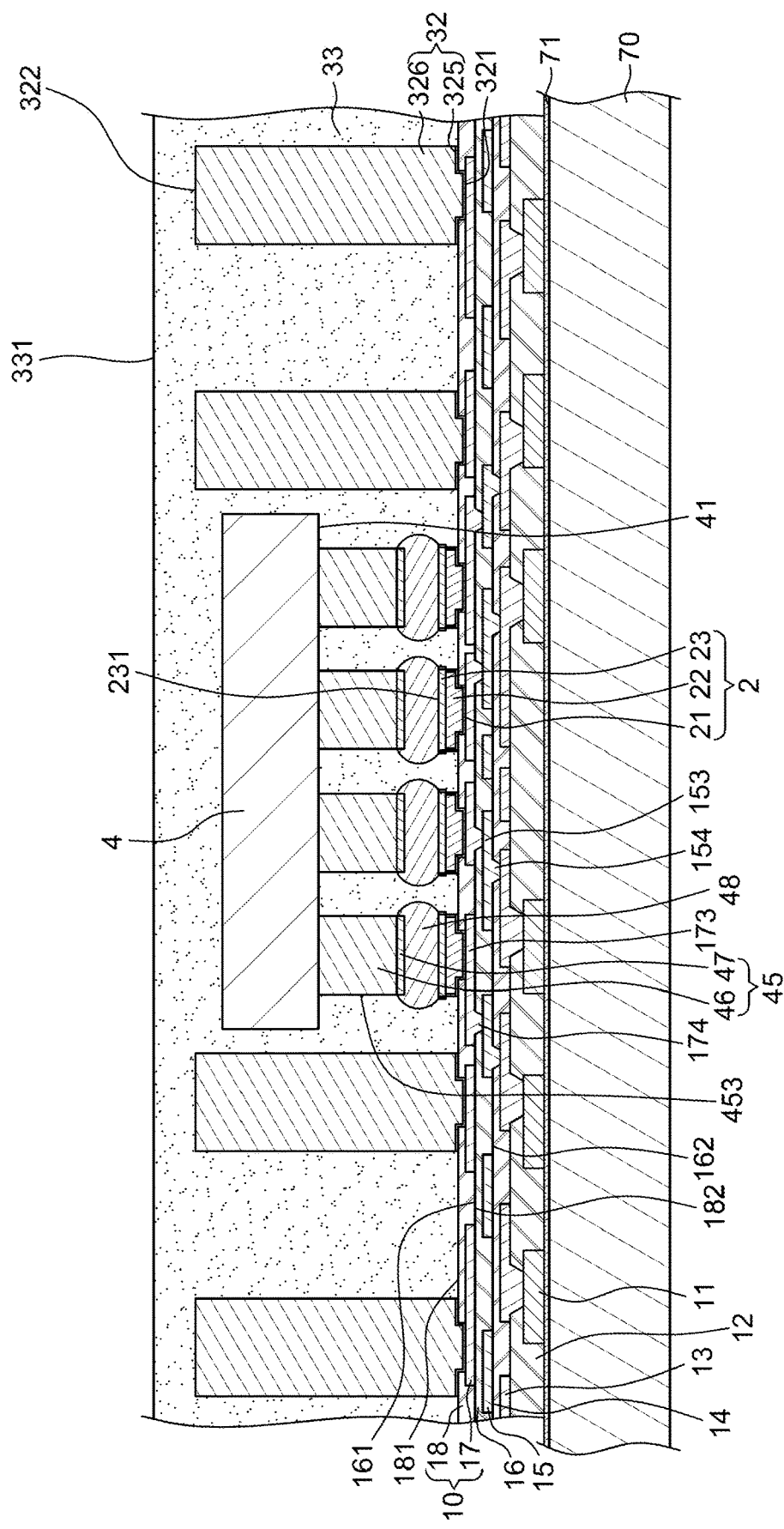
FIG. 23 illustrates one or more stages of an example of a method for manufacturing a semiconductor device structure according to some embodiments of the present disclosure.

Referring to FIG. 23, an encapsulant 33 is formed to cover the semiconductor die 4 and the first conductive post 32. The encapsulant 33 is disposed on the first redistribution layer 10, such as on the passivation layer 18 of the first redistribution layer 10. A material of the encapsulant 33 may be a molding compound with or without fillers. In some embodiments, the encapsulant 33 may encapsulate the entire semiconductor die 4, and may surround the second conductive post 45 and the electrical pad 2. As shown in FIG. 23, the encapsulant 33 may cover the second end 322 of the first conductive post 32.

Formation of the encapsulant 33 may involve in-process curing at about 230° C. for about 400 seconds, and post-mold curing at about 150° C. for about 1 hour. These thermal processes may result in IMC (e.g., including $Cu_6Sn_5$ and/or $Cu_3Sn$) formed at the junction of tin (e.g., the internal connector 48) and copper (e.g., the conductive layer 22 of the electrical pad 2, or the conductive section 46 of the second conductive post 45). However, since the internal connector 48 is retained on the barrier layer 23 without contacting the conductive layer 22, IMC at the junction of the internal connector 48 and the electrical pad 2 can be prevented, or at least reduced. Besides, since the internal connector 48 contacts merely the barrier section 47 of the second conductive post 45, IMC at the junction of the internal connector 48 and the second conductive post 45 can also be prevented, or at least reduced. In some embodiments, a small amount of IMC made of $(Cu,Ni)_6Sn_5$ may still be formed during such thermal processes.

Figure 24:
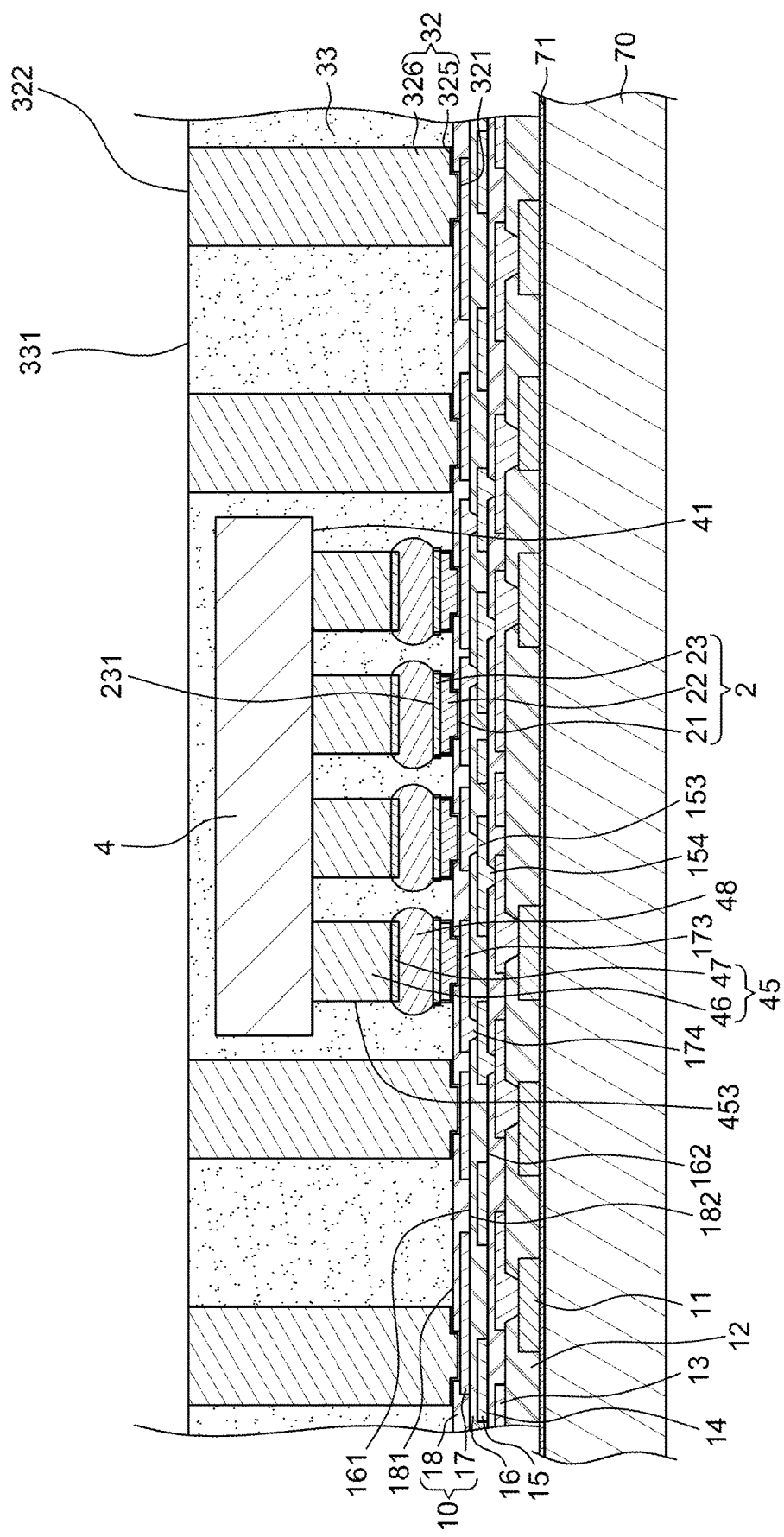
FIG. 24 illustrates one or more stages of an example of a method for manufacturing a semiconductor device structure according to some embodiments of the present disclosure.

Referring to FIG. 24, a portion of the encapsulant 33 is removed by, for example, grinding, to expose the second end 322 of the first conductive post 32. Accordingly, the second end 322 of the first conductive post 32 may be substantially coplanar with an upper surface 331 of the encapsulant 33.

Figure 25:
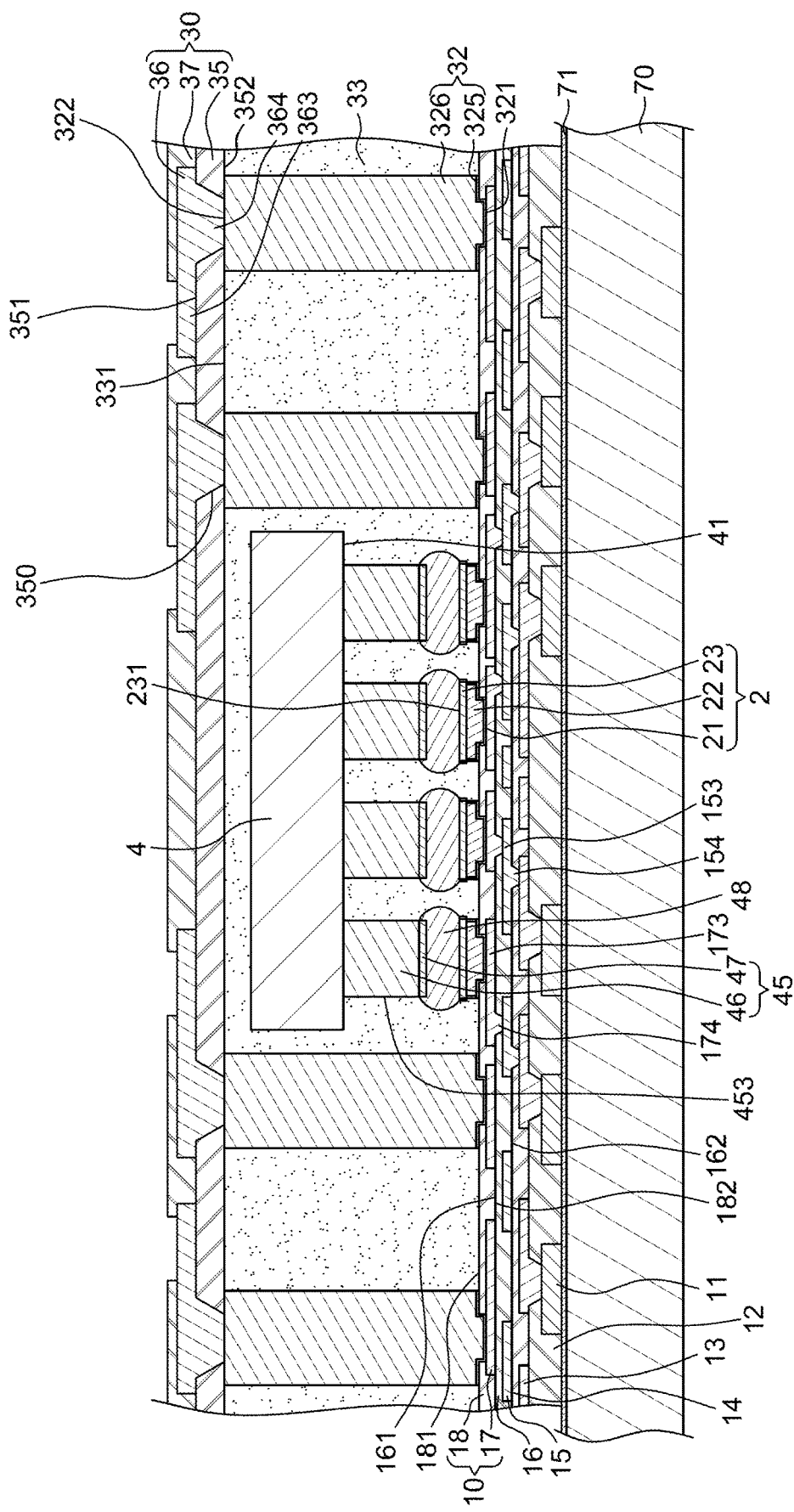
FIG. 25 illustrates one or more stages of an example of a method for manufacturing a semiconductor device structure according to some embodiments of the present disclosure.

Referring to FIG. 25, a second redistribution layer 30 (e.g., including a lower passivation layer 35, a metal layer 36 and an upper passivation layer 37) is formed on the encapsulant 33, and the second redistribution layer 30, such as the lower passivation layer 35 and the upper passivation layer 37, may be cured. The second redistribution layer 30 may be formed by similar processes and using similar materials as the first redistribution layer 10. For example, the lower passivation layer 35 may be formed or disposed on the upper surface 331 of the encapsulant 33, and may be cured at about 230° C. for about 6 hours. The lower passivation layer 35 has an upper surface 351 and a lower surface 352 opposite to the upper surface 351. The lower surface 352 contacts the upper surface 331 of the encapsulant 33. The lower passivation layer 35 defines an opening 350 extending through the lower passivation layer 35 to expose at least a portion of the second end 322 of the first conductive post 32.

Then, the metal layer 36 may be formed or disposed on the upper surface 352 and in the opening 350 of the lower passivation layer 35. For example, the metal layer 36 may include a bonding pad 363, a conductive via 364 and a trace (not shown). The conductive pad 363 and the trace (not shown) may be disposed on the upper surface 351 of the lower passivation layer 35. The conductive via 364 is disposed in the opening 350 of the lower passivation layer 35 and electrically connects to the second end 322 of the first conductive post 32.

Then, the upper passivation layer 37 may be formed or disposed on the lower passivation layer 35 and on the metal layer 36, and may be cured at about 230° C. for about 6 hours. The upper passivation layer 37 is disposed on the upper surface 352 of the lower passivation layer 35, and covers the metal layer 36. The upper passivation layer 37 may expose a portion of the metal layer 36, such as the bonding pad 363 of the metal layer 36, for external connection.

These thermal processes during formation of the lower passivation layer 35 and the upper passivation layer 37 may result in IMC (e.g., including $Cu_6Sn_5$ and/or $Cu_3Sn$) formed at the junction of tin (e.g., the internal connector 48) and copper (e.g., the conductive layer 22 of the electrical pad 2, or the conductive section 46 of the second conductive post 45). However, since the internal connector 48 is retained on the barrier layer 23 without contacting the conductive layer 22, IMC at the junction of the internal connector 48 and the electrical pad 2 can be prevented, or at least reduced. Besides, since the internal connector 48 contacts merely the barrier section 47 of the second conductive post 45, IMC at the junction of the internal connector 48 and the second conductive post 45 can also be prevented, or at least reduced. In some embodiments, a small amount of IMC made of $(Cu,Ni)_6Sn_5$ may still be formed during such thermal processes.

Figure 26:
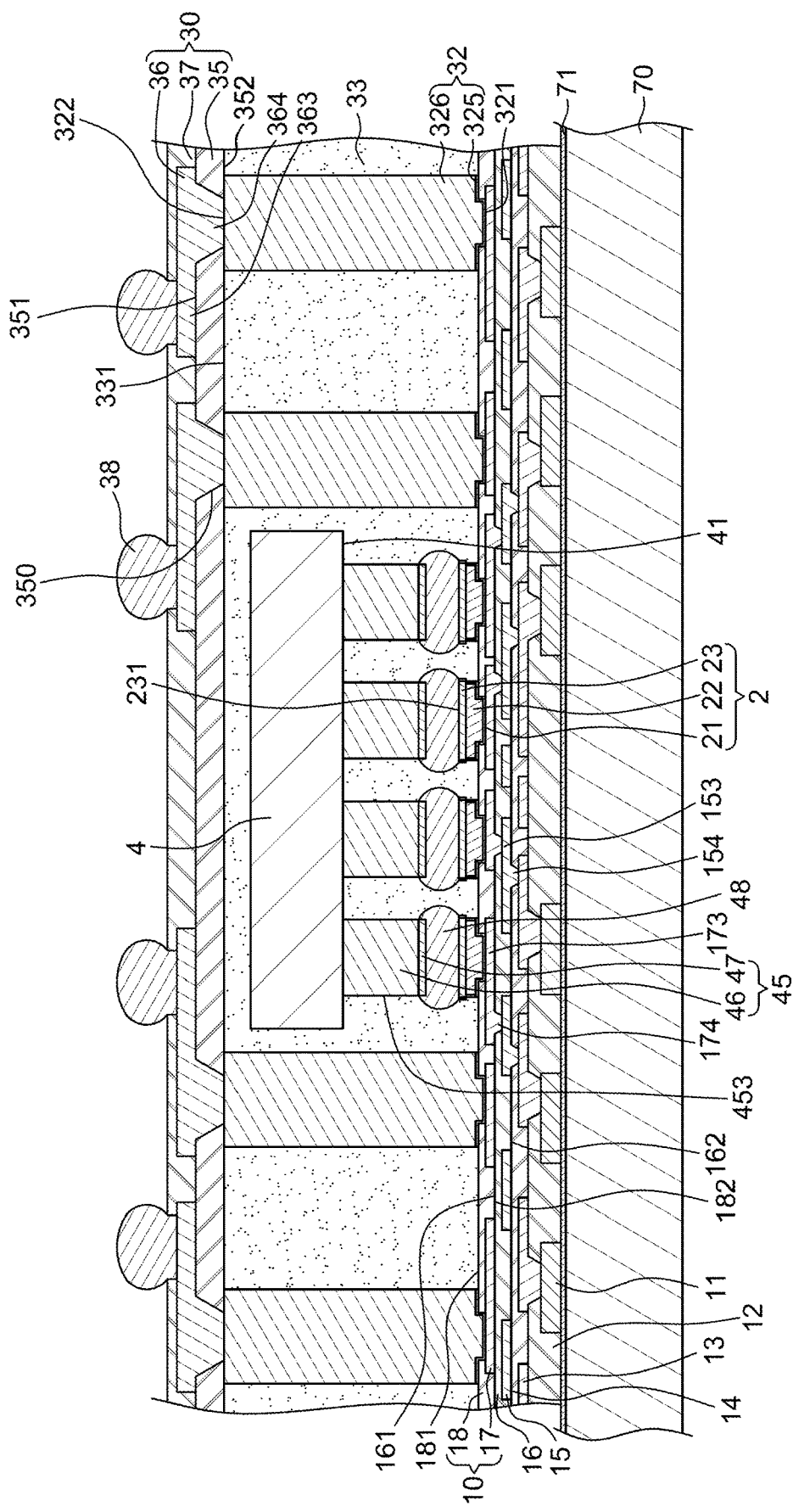
FIG. 26 illustrates one or more stages of an example of a method for manufacturing a semiconductor device structure according to some embodiments of the present disclosure.

Referring to FIG. 26, an external connector 38 is formed or disposed on the bonding pad 363 of the metal layer 36 of the second redistribution layer 30. For example, the external connector 38 may be a solder ball formed by solder paste printing and reflowing processes.

Figure 27:
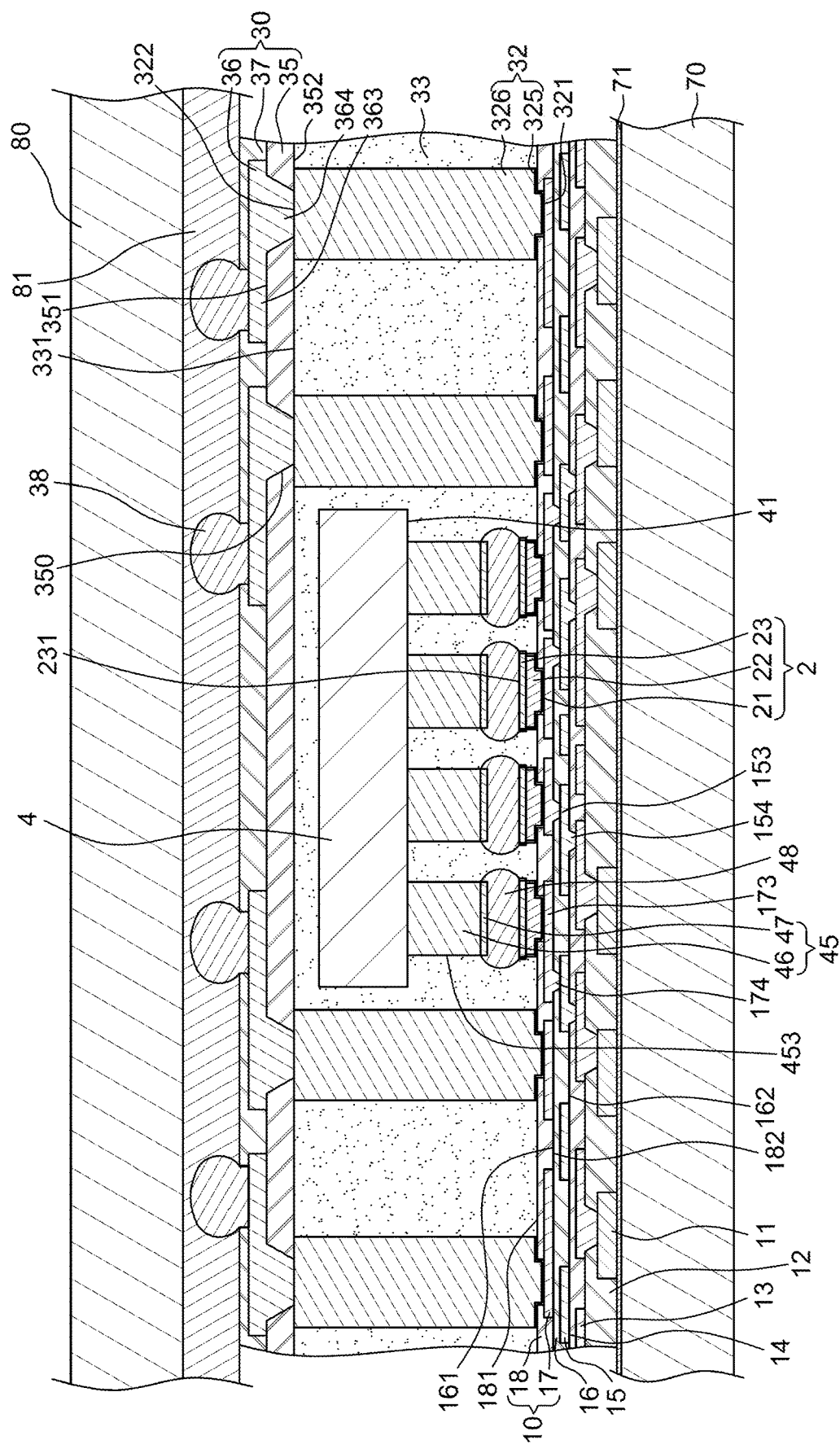
FIG. 27 illustrates one or more stages of an example of a method for manufacturing a semiconductor device structure according to some embodiments of the present disclosure.

Referring to FIG. 27, a second carrier 80 is provided with an adhesive layer 81 disposed thereon. The second redistribution layer 30 is attached to the second carrier 80, and the external connector 38 is embedded in the adhesive layer 81.

Figure 28:
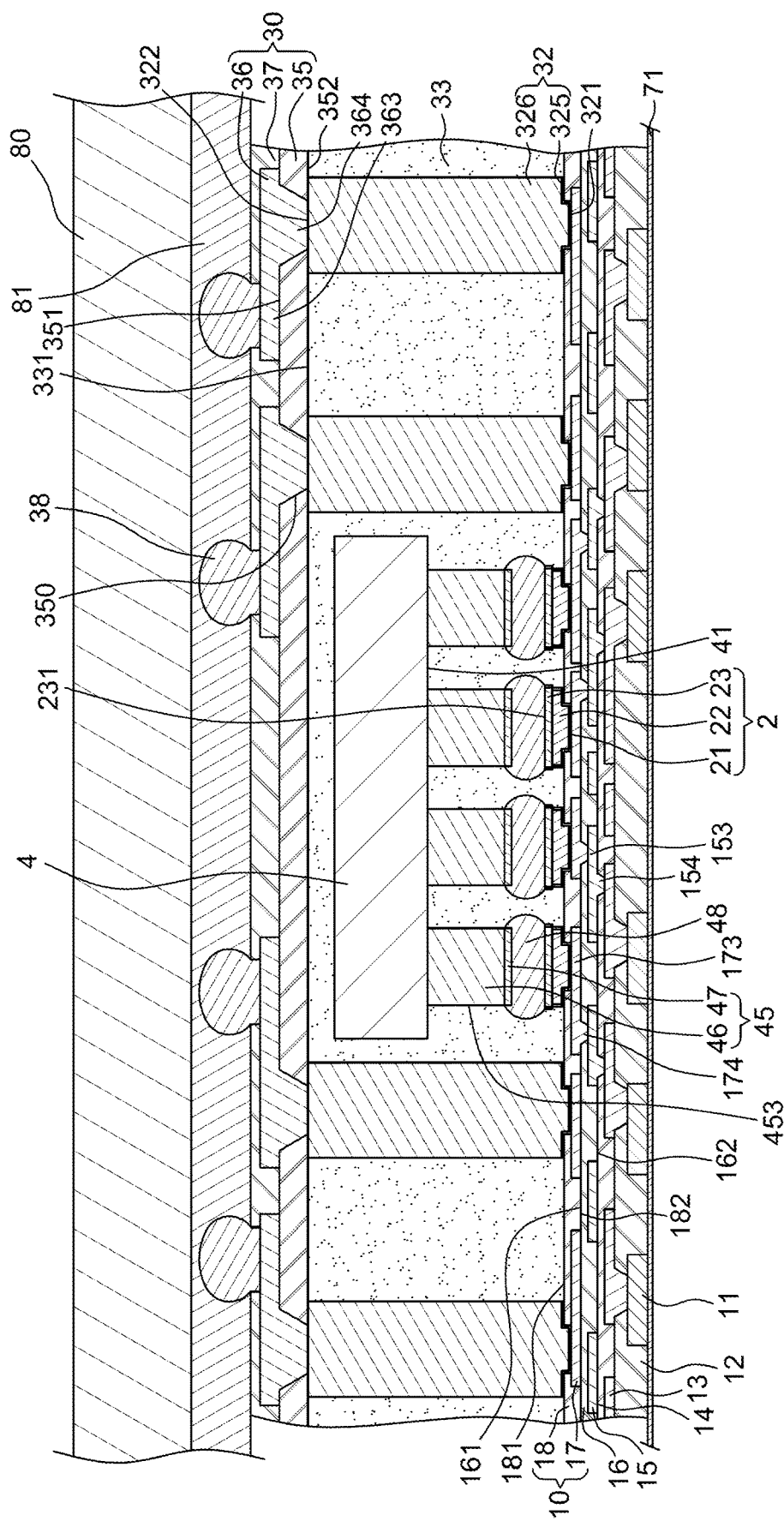
FIG. 28 illustrates one or more stages of an example of a method for manufacturing a semiconductor device structure according to some embodiments of the present disclosure.

Referring to FIG. 28, the first carrier 70 is removed, such that the seed layer 71 is exposed.

Figure 29:
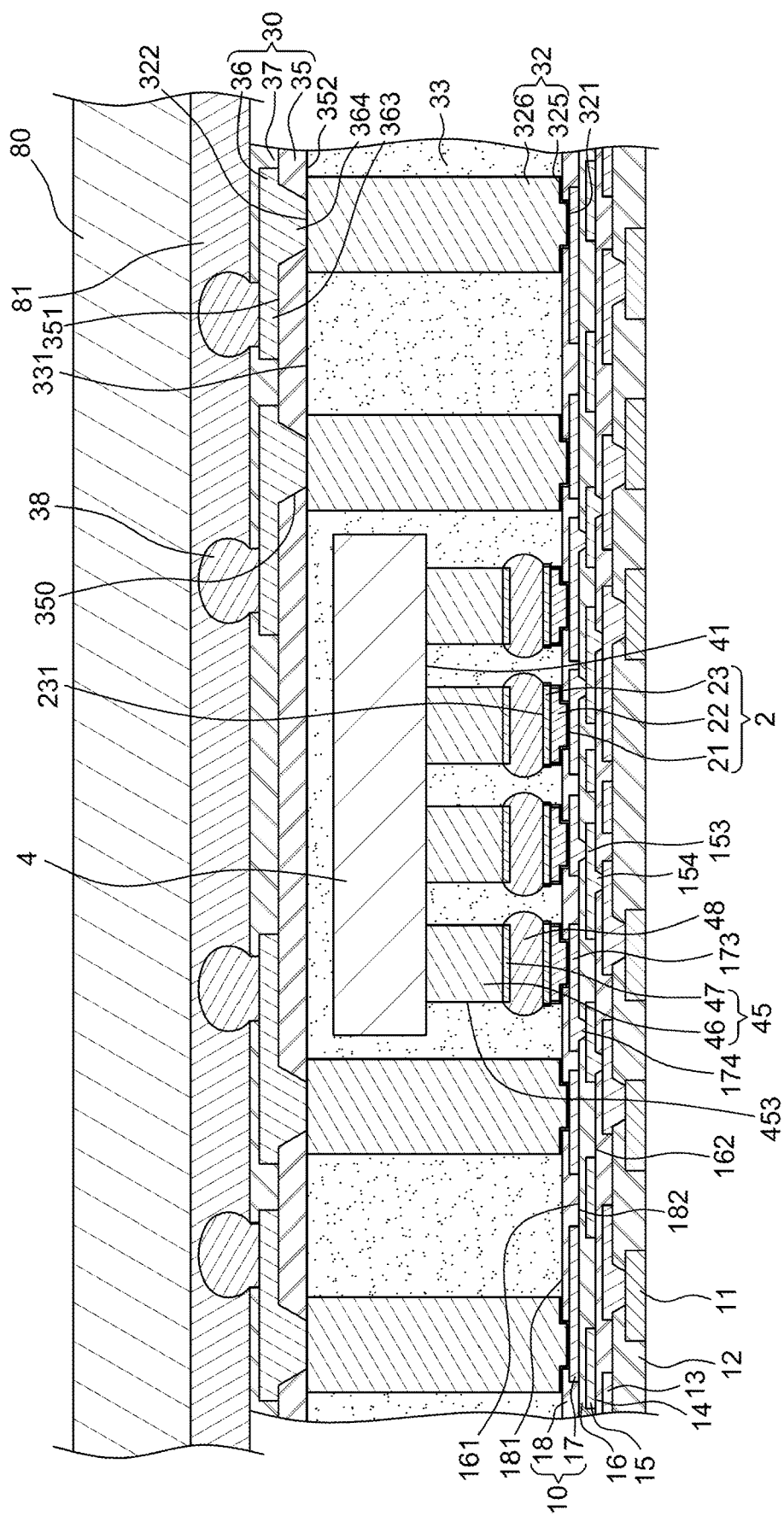
FIG. 29 illustrates one or more stages of an example of a method for manufacturing a semiconductor device structure according to some embodiments of the present disclosure.

Referring to FIG. 29, the seed layer 71 is removed by, for example, etching. A portion of the metal layer 11 of the first circuit layer is thus exposed.

Figure 30:
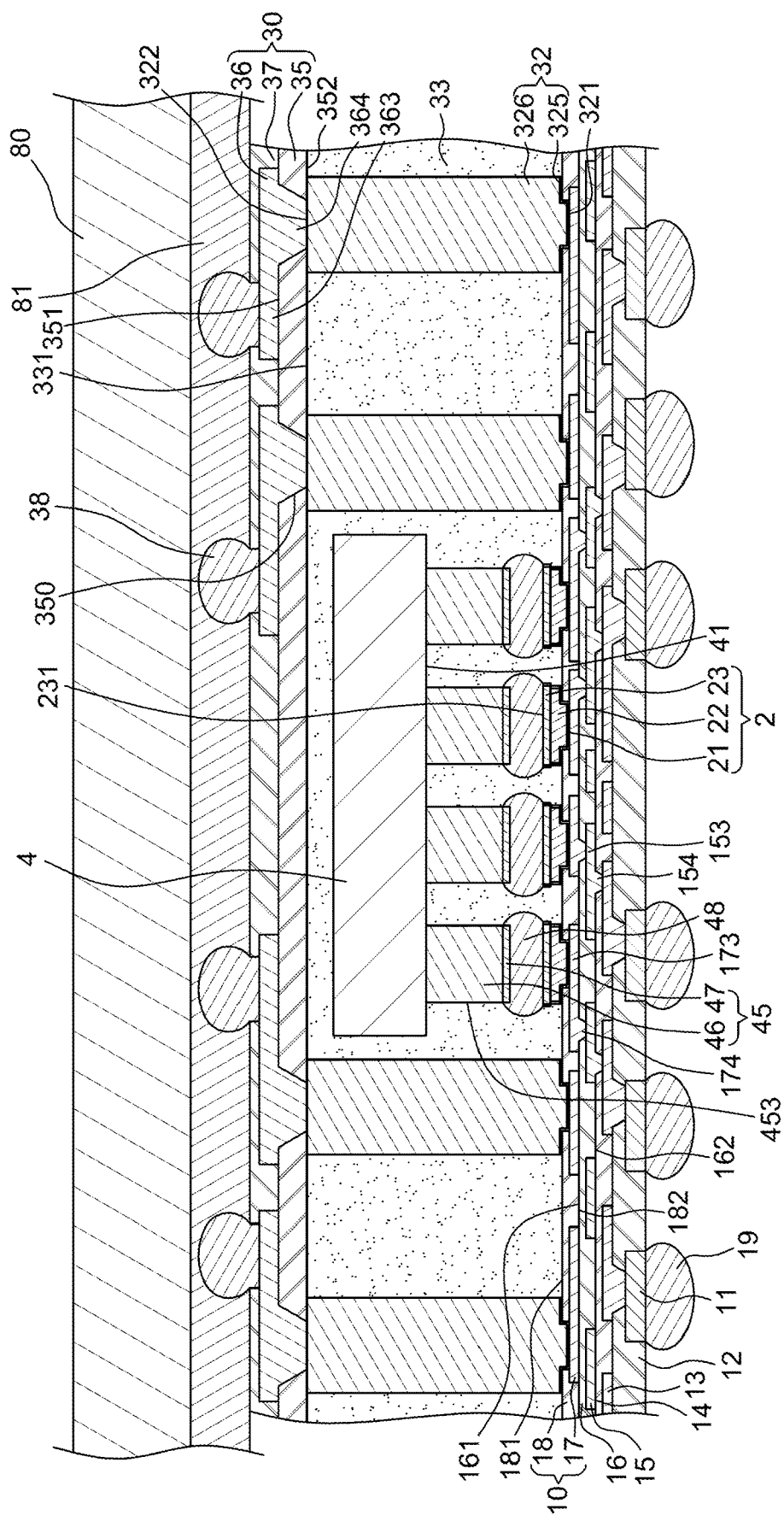
FIG. 30 illustrates one or more stages of an example of a method for manufacturing a semiconductor device structure according to some embodiments of the present disclosure.

Referring to FIG. 30, a solder ball 19 is formed or disposed on the exposed portion of the metal layer 11 of the first circuit layer by, for example, solder paste printing and reflowing process.

Figure 31:
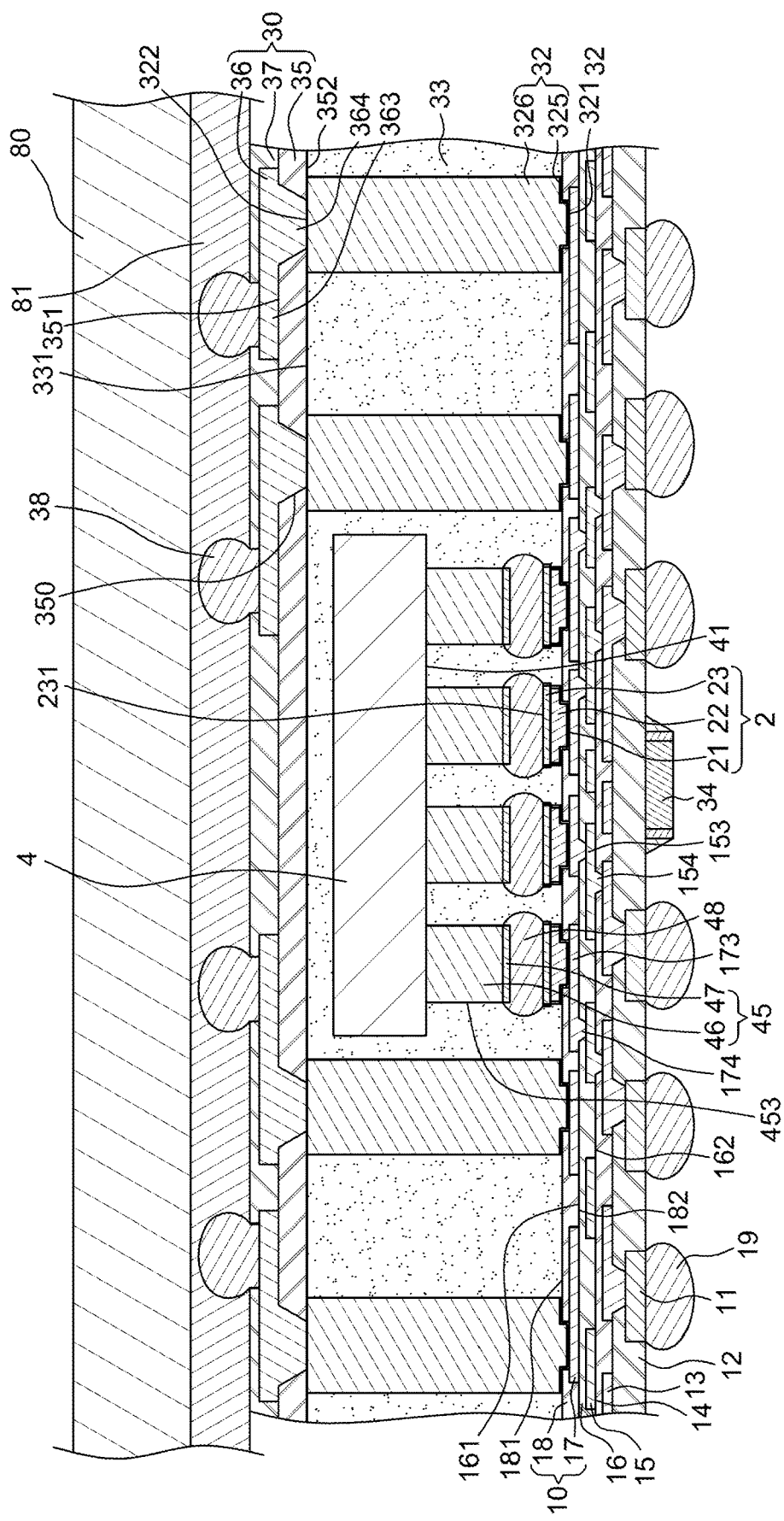
FIG. 31 illustrates one or more stages of an example of a method for manufacturing a semiconductor device structure according to some embodiments of the present disclosure.

Referring to FIG. 31, a first electronic component 34 is disposed on and connected to the first circuit layer, such as the metal layer 11 of the first circuit layer. In some embodiments, the first electronic component 34 may be a passive component.

Figure 32:
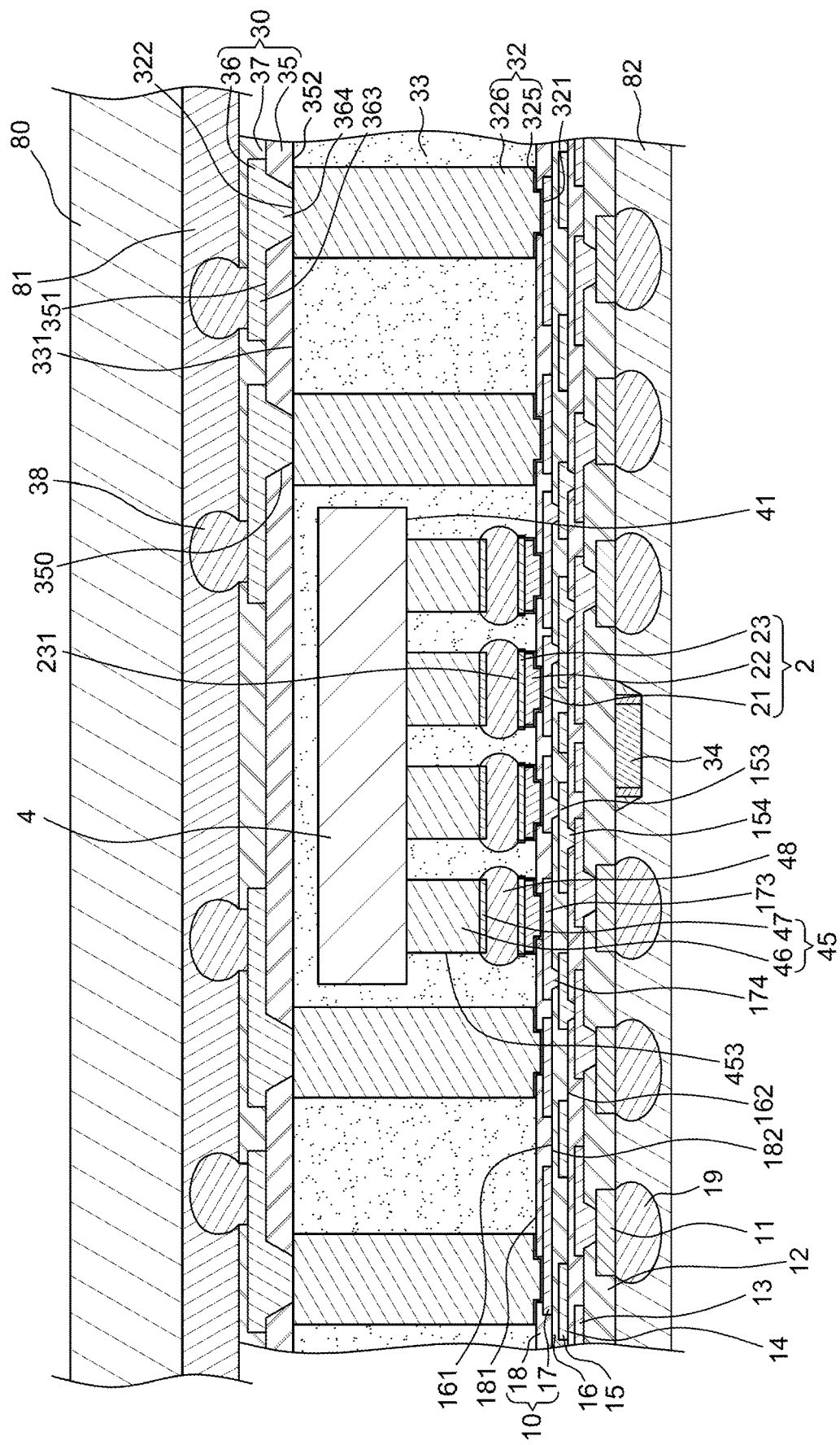
FIG. 32 illustrates one or more stages of an example of a method for manufacturing a semiconductor device structure according to some embodiments of the present disclosure.

Referring to FIG. 32, a tape 82 is attached to the first circuit layer, and the solder ball 19 and the first electronic component 34 may be embedded in the tape 82.

Figure 33:
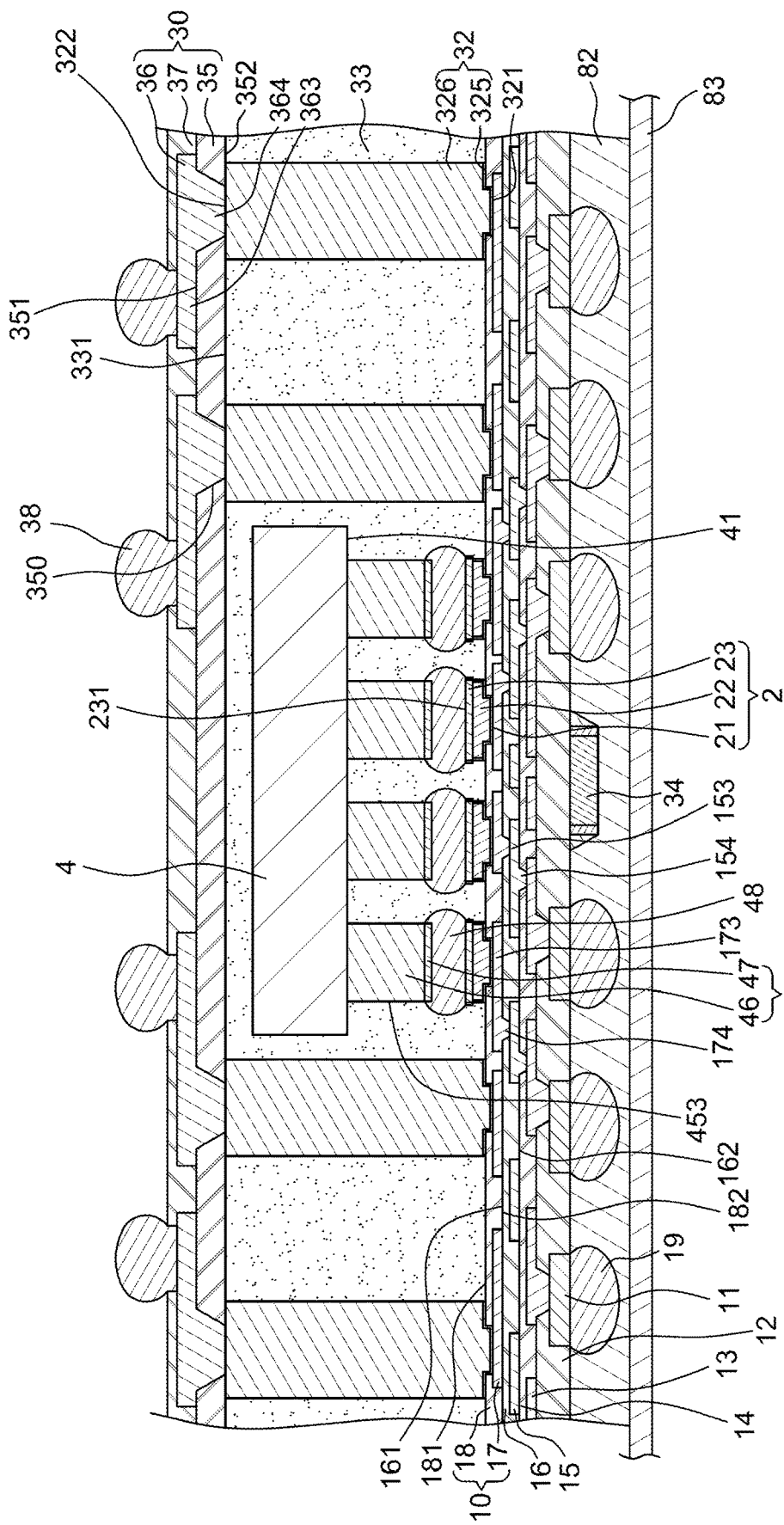
FIG. 33 illustrates one or more stages of an example of a method for manufacturing a semiconductor device structure according to some embodiments of the present disclosure.

Referring to FIG. 33, a frame 83 is attached to the tape 82. Then, the second carrier 80 and the adhesive layer 81 are removed.

Figure 34:
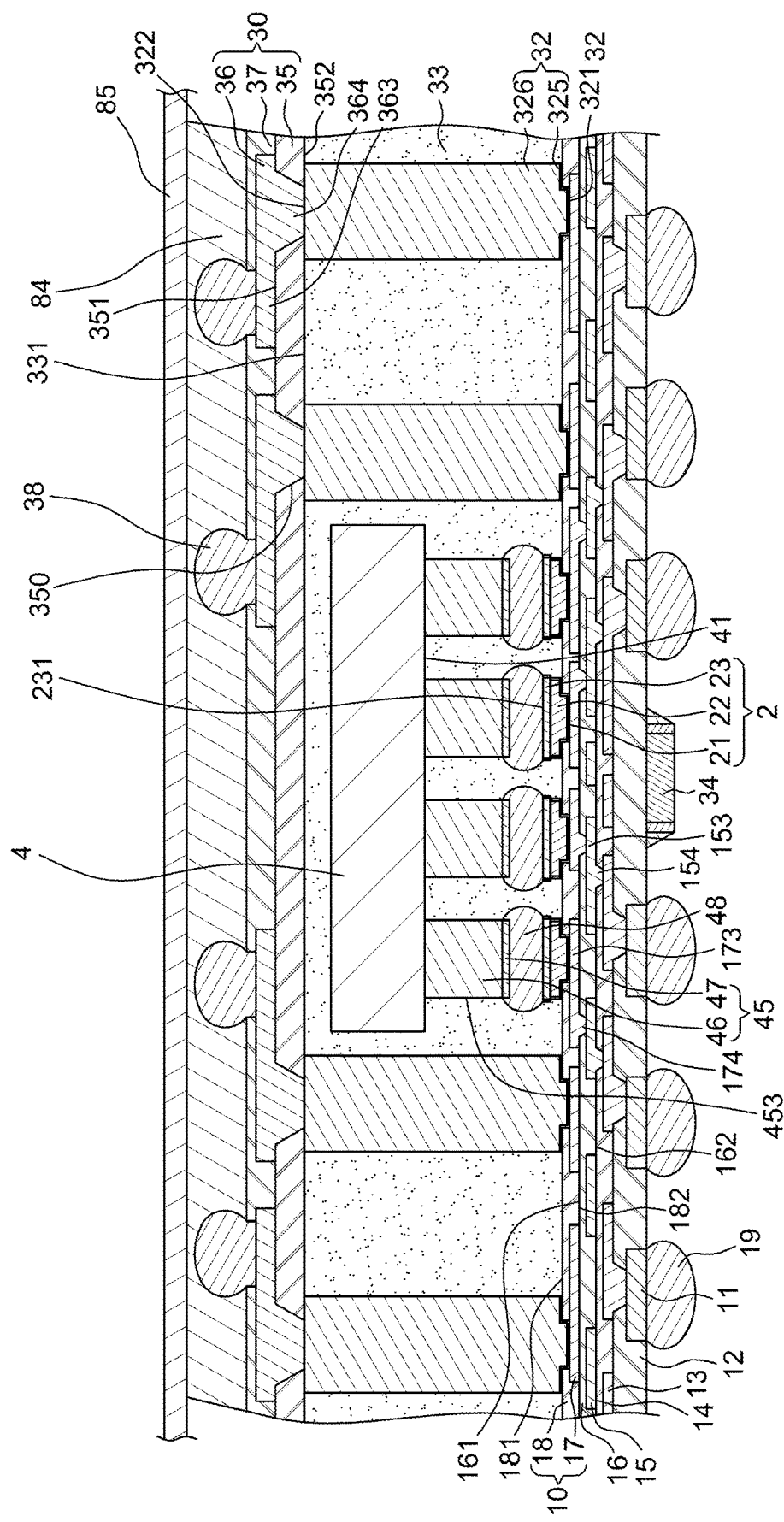
FIG. 34 illustrates one or more stages of an example of a method for manufacturing a semiconductor device structure according to some embodiments of the present disclosure.

Referring to FIG. 34, the second redistribution layer 30 is attached to another frame 85 by another tape 84. Then, the frame 83 and the tape 82 are removed.

Figure 35:
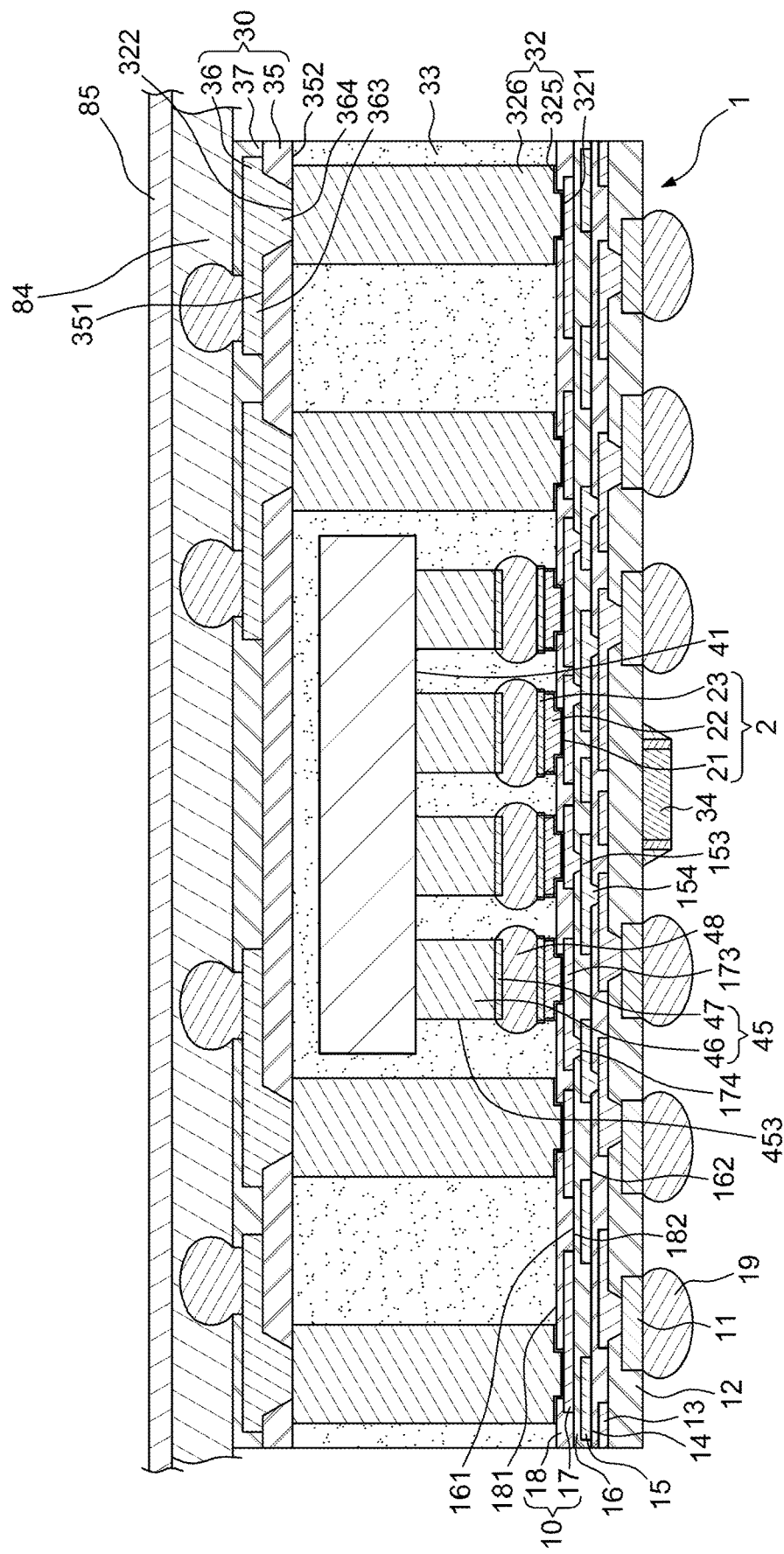
FIG. 35 illustrates one or more stages of an example of a method for manufacturing a semiconductor device structure according to some embodiments of the present disclosure.

Referring to FIG. 35, a singulation process is conducted to cut through the first circuit layer (e.g., including the passivation layer 12 and the metal layer 11), the second circuit layer (e.g., including the passivation layer 14 and the metal layer 13), third circuit layer (e.g., including the passivation layer 16 and the metal layer 15), the first redistribution layer 10 (e.g., including a passivation layer 18 and a metal layer 17), the encapsulant 33, and the second redistribution layer 30 (e.g., including a lower passivation layer 35, a metal layer 36 and an upper passivation layer 37).

Figure 36:
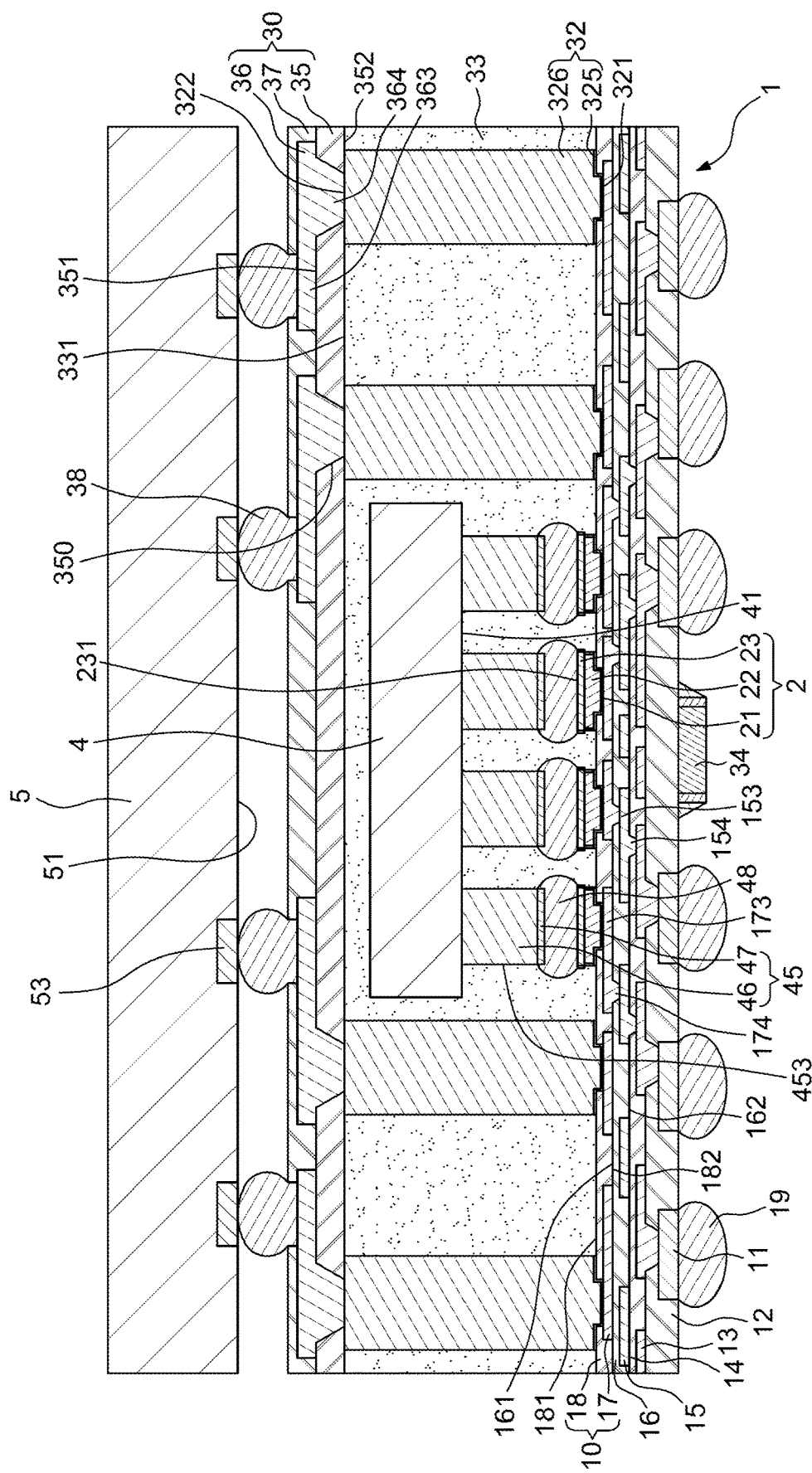
FIG. 36 illustrates one or more stages of an example of a method for manufacturing a semiconductor device structure according to some embodiments of the present disclosure.

Referring to FIG. 36, the frame 85 and the tape 84 are removed. Then, a second electronic component 5 is disposed on the second redistribution layer 30 and contacts the external connector 38. The second electronic component 5 may be a random access memory (RAM). The second electronic component 5 has a lower surface 51 faces the second redistribution layer 30, and may include a conductive pad 53 exposed from the lower surface 51. The external connector 38 contacts the conductive pad 53.

Figure 37:
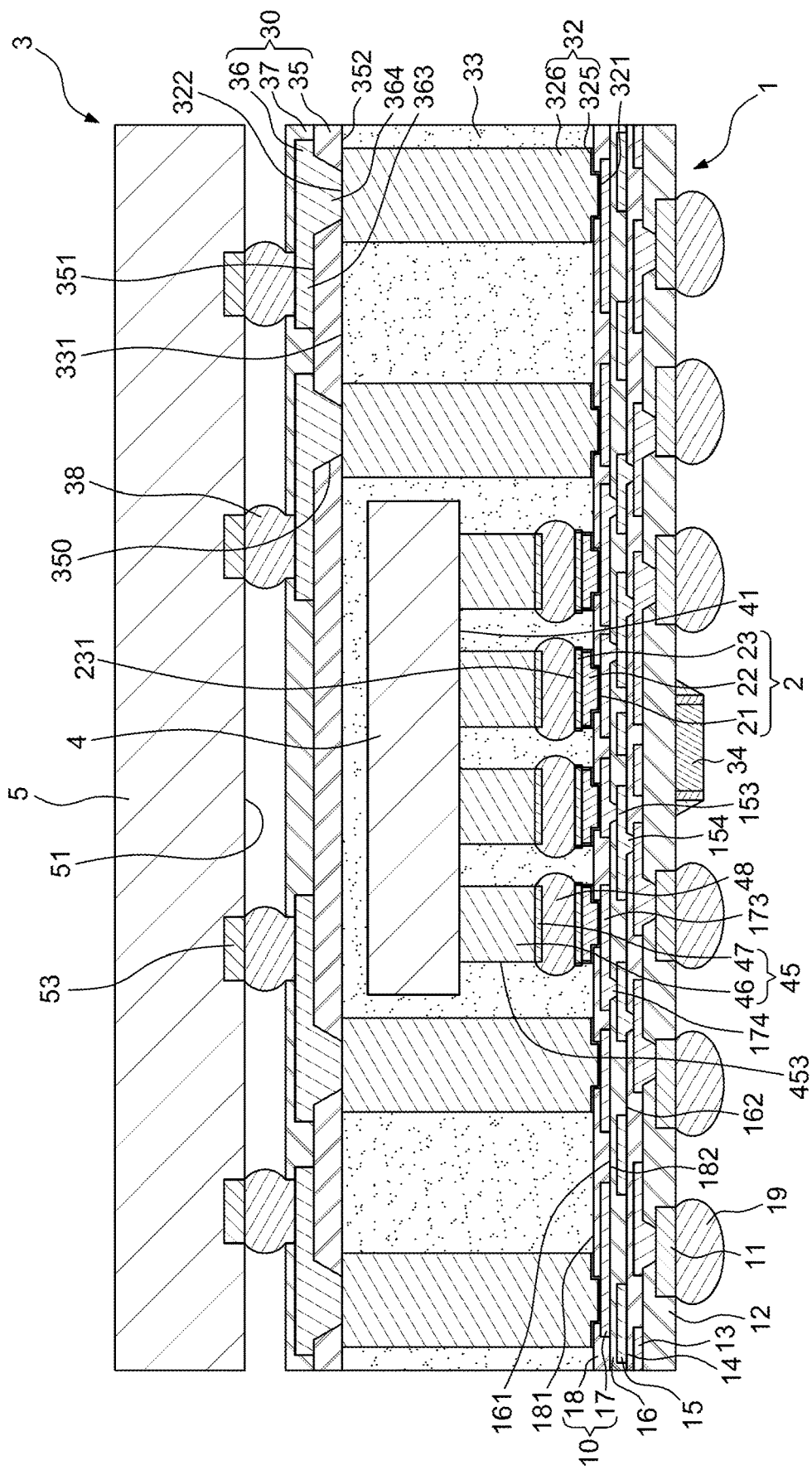
FIG. 37 illustrates one or more stages of an example of a method for manufacturing a semiconductor device structure according to some embodiments of the present disclosure.

Referring to FIG. 37, a reflowing process is conducted to connect the second electronic component 5 to the second redistribution layer 30, thus forming the semiconductor device structure 3 shown in FIGS. 3 and 4. The external connector 38 connects between the bonding pad 363 of the metal layer 36 and the conductive pad 53 of the second electronic component 5.

In some embodiments, after the stage shown in FIG. 14, portions of the seed layer 21a which are not covered by the conductive layer 22a may be removed, and a solder ball 19 may be disposed on an exposed portion of the metal layer 11 of the first circuit layer after removal of the carrier, thus forming the wiring structure 1 shown in FIGS. 1 and 2. For example, the portions of the seed layer 21a may be removed by etching, and a peripheral region of the conductive layer 22a (e.g., with a thickness of about 1 μm to about 2 μm) may also be etched, forming the conductive layer 22 shown in FIG. 1. Accordingly, the maximum width of the conductive layer 22 may be less than the maximum width of the barrier layer 23, such as about 1 μm to about 2 μm less at each side. That is, the lateral surface 223 of the conductive layer 22 may be located within the lateral surface 233 of the barrier layer 23. Besides, peripheral regions of the conductive layer 22 and the barrier layer 23 may be oxidized during such etching process, forming an oxide layer 25 adjacent to the lateral surface 203 of the electrical pad 2. The oxide layer 25 may include a first portion 251 disposed adjacent to the lateral surface 223 of the conductive layer 22, and a second portion 252 disposed adjacent to the lateral surface 233 of the barrier layer 23. The first portion 251 of the oxide layer 25 may include copper oxide, and the second portion 252 of the oxide layer 25 may include nickel oxide. Though not shown in FIG. 1, the seed layer 21 and/or the anti-oxidation layer 24 may also include oxidation layer or oxidation region. In other embodiments, the peripheral region of the conductive layer 22a is not etched, thus forming the wiring structure 1a shown in FIGS. 3 and 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device structure, comprising:
   a first redistribution layer;
   an electrical pad disposed on the first redistribution layer, wherein the electrical pad comprises a conductive layer and a barrier layer, and further comprises an oxide layer disposed adjacent to a lateral surface of the electrical pad, wherein the oxide layer is formed by oxidation of a peripheral region of the electrical pad;
   a semiconductor die disposed on the first redistribution layer and electrically connecting to the electrical pad;
   at least one first conductive post disposed on the first redistribution layer and adjacent to the semiconductor die; and
   an encapsulant covering the semiconductor die and the first conductive post.

2. The semiconductor device structure of claim 1, wherein the first redistribution layer comprises a passivation layer and a metal layer, the metal layer is embedded in the passivation layer, the passivation layer defines an opening to expose a portion of the metal layer,
   the electrical pad is disposed in the opening of the passivation layer and on the metal layer, and the electrical pad further comprises a seed layer.

3. The semiconductor device structure of claim 1, wherein the conductive layer includes copper, and the barrier layer includes nickel.

4. The semiconductor device structure of claim 3, wherein the oxide layer includes a first portion disposed adjacent to a lateral surface of the conductive layer, and the first portion of the oxide layer includes copper oxide.

5. The semiconductor device structure of claim 3, wherein the oxide layer includes a second portion disposed adjacent to a lateral surface of the barrier layer, and the second portion of the oxide layer includes nickel oxide.

6. The semiconductor device structure of claim 1, wherein the conductive layer contacts the seed layer, and the barrier layer contacts the conductive layer.

7. The semiconductor device structure of claim 1, wherein a maximum width of the conductive layer is less than a maximum width of the barrier layer.

8. The semiconductor device structure of claim 1, wherein the electrical pad further comprises a seed layer, the conductive layer contacts the seed layer, and the barrier layer contacts the conductive layer.

9. The semiconductor device structure of claim 1, wherein the semiconductor die includes a second conductive post, the second conductive post is connected to the electrical pad through an internal connector, and the internal connector contacts a lateral surface of the second conductive post.

10. The semiconductor device structure of claim 1, further comprising a second redistribution layer disposed on the encapsulant and electrically connected to the first conductive post.

11. The semiconductor device structure of claim 10, wherein the second redistribution layer comprises a bonding pad.

12. A method for manufacturing a semiconductor device structure, comprising:
(a) forming a first redistribution layer;
(b) forming an electrical pad on the first redistribution layer, wherein the electrical pad comprises a conductive layer, a barrier layer and an anti-oxidation layer;
(c0) forming a photoresist layer on the electrical pad and defining at least one through hole;
(c) forming at least one conductive post on the first redistribution layer and in the through hole of the photoresist layer;
(c1) removing the photoresist layer, and forming an oxide layer adjacent to a lateral surface of the electrical pad, wherein the oxide layer is formed by oxidation of a peripheral region of the electrical pad;
(d) disposing a semiconductor die on the first redistribution layer and electrically connecting the semiconductor die to the electrical pad; and
(e) forming an encapsulant to cover the semiconductor die and the conductive post.

13. The method of claim 12, wherein the photoresist layer is a dry film.

14. The method of claim 12, wherein after step (e), the method further comprises:
(e1) forming a second redistribution layer on the encapsulant; and
(e2) curing the second redistribution layer.

15. The method of claim 14, wherein after step (e2), the method further comprises:
(e3) forming an external connector on the second redistribution layer.

* * * * *